United States Patent
Imada et al.

[11] Patent Number: 5,994,821
[45] Date of Patent: Nov. 30, 1999

[54] DISPLACEMENT CONTROL ACTUATOR

[75] Inventors: Katsumi Imada, Katano; Tetsuro Otsuchi, Osaka; Masato Sugimoto, Osaka; Yoshihiro Tomita, Osaka; Osamu Kawasaki, Kyotanabe, all of Japan

[73] Assignee: Matsushita Electric Industrial Co., Ltd., Osaka, Japan

[21] Appl. No.: 08/978,422

[22] Filed: Nov. 25, 1997

[30] Foreign Application Priority Data

Nov. 29, 1996 [JP] Japan .................................. 8-318445

[51] Int. Cl.$^6$ .................................................. H01L 41/04
[52] U.S. Cl. ......................... 310/332; 310/360; 310/348
[58] Field of Search ...................................... 310/328, 330, 310/331, 332, 348, 360, 361

[56] References Cited

U.S. PATENT DOCUMENTS

| | | | |
|---|---|---|---|
| 5,289,074 | 2/1994 | Mori | 310/328 |
| 5,319,324 | 6/1994 | Satoh et al. | 310/315 |
| 5,438,232 | 8/1995 | Inoue et al. | 310/328 |
| 5,440,194 | 8/1995 | Beurrier | 310/328 |
| 5,446,330 | 8/1995 | Eda et al. | 310/313 A |
| 5,453,652 | 9/1995 | Eda et al. | 310/313 R |
| 5,808,782 | 9/1998 | Min | 310/328 |

FOREIGN PATENT DOCUMENTS

| | | |
|---|---|---|
| 58095710 | 6/1983 | Japan . |
| 58189618 | 11/1983 | Japan . |
| 7-030354 | 1/1995 | Japan . |
| 07086866 | 3/1995 | Japan . |
| 07094801 | 4/1995 | Japan . |
| 07193294 | 7/1995 | Japan . |

OTHER PUBLICATIONS

Fowler, V.J. et al., "A Survey of Laser Beam Deflection Techniques", *Proceedings of The IEEE*, vol. 54, No 10, Oct. 1966.

*Primary Examiner*—Thomas M. Dougherty
*Assistant Examiner*—Peter Medley
*Attorney, Agent, or Firm*—Smith, Gambrell & Russell

[57] ABSTRACT

Rectangular piezoelectric substrates each of which has main surfaces opposed to each other, measures 50 $\mu$m thick by 1 mm wide by 8 mm long, and is made of lithium niobate (LiNbO$_3$), are directly bonded on the main surfaces so that their axes of polarization are set in directions reverse to each other, thereby composing a piezoelectric element. Electrodes which are 0.2 $\mu$m thick and made of chromium-nickel are formed on the two main surfaces of the piezoelectric element opposed to each other, thereby resulting in a precision displacement control actuator of a bimorph type mechanical-electrical converter element. This configuration makes it possible to provide a compact precision displacement control actuator which has a large displacement and extremely small variations of characteristics such as displacement and resonance frequency.

25 Claims, 27 Drawing Sheets

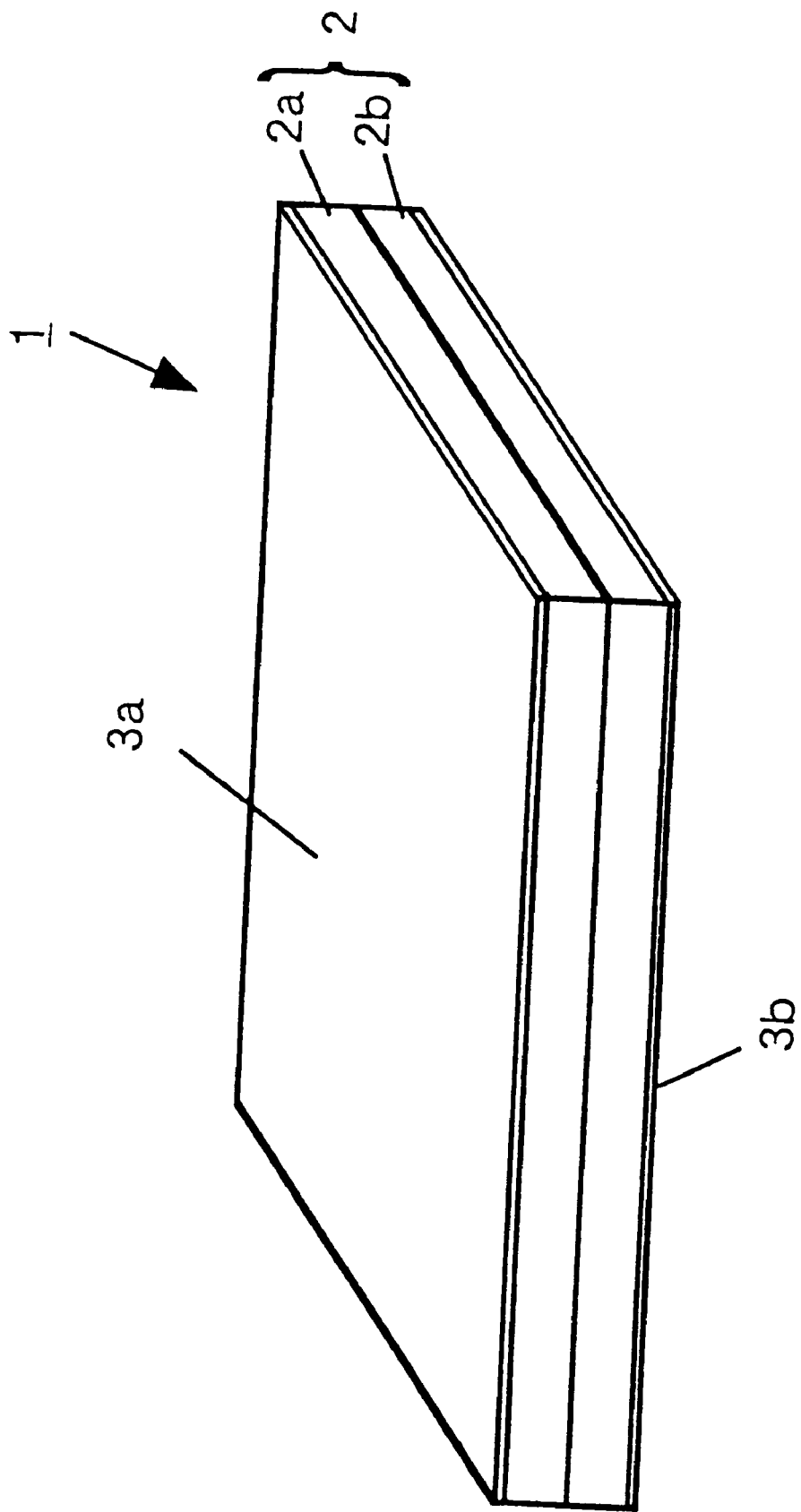

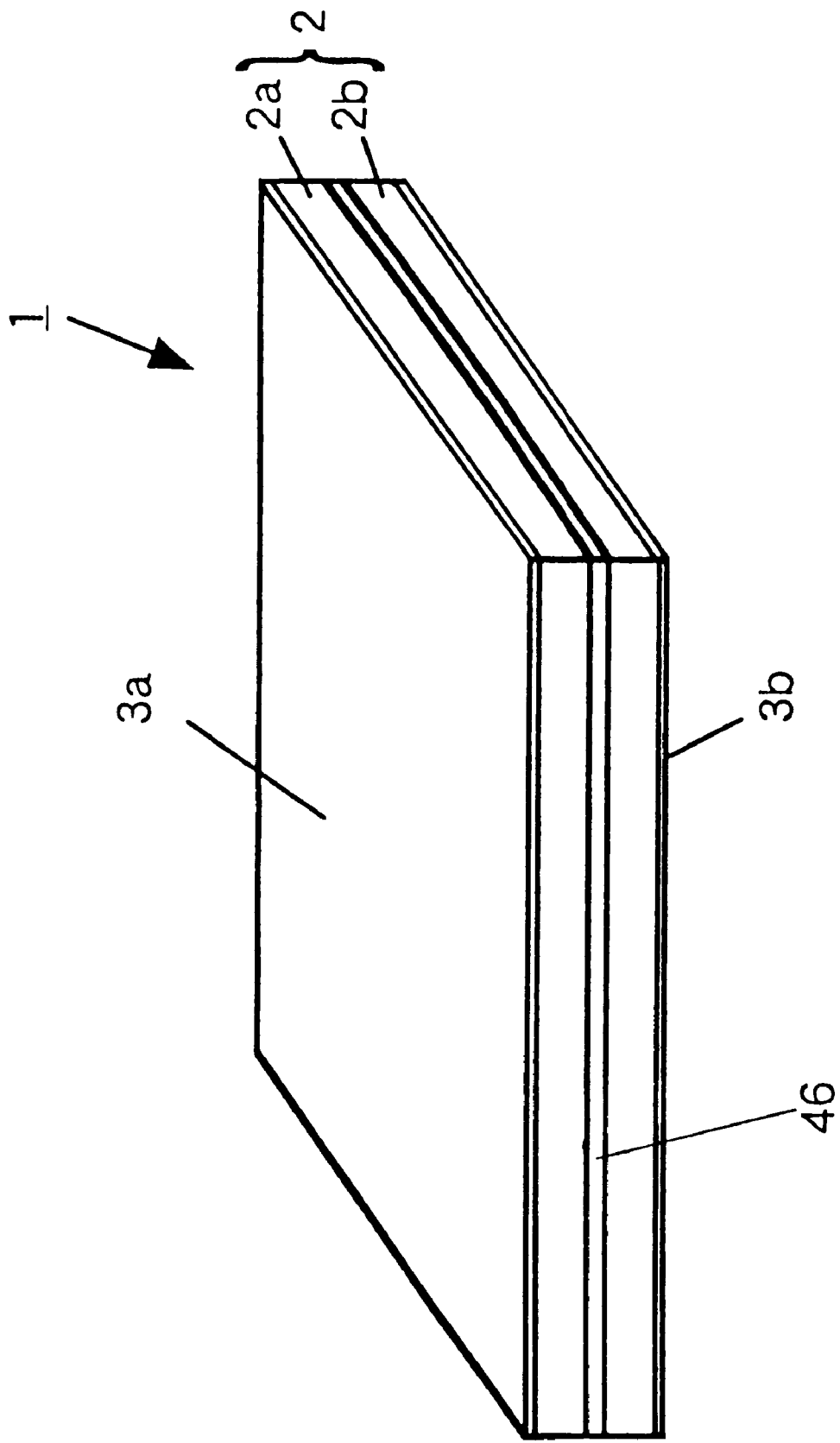

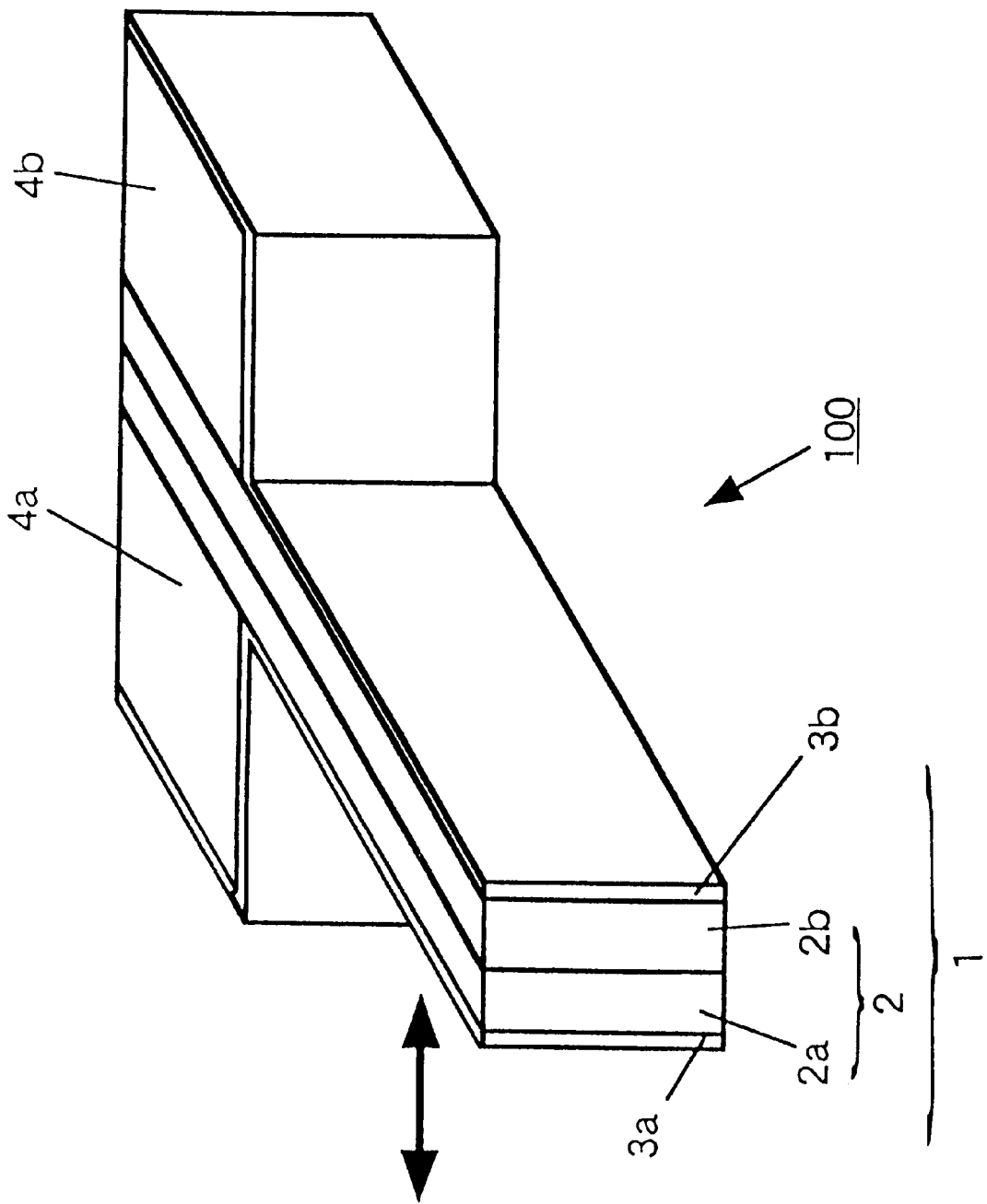

When LiNbO₃ substrate is rotated around X axis

When Li$_2$B$_4$O$_7$ substrate is rotated around X axis

When $Li_2B_4O_7$ substrate is rotated around Z axis

When KNbO₃ is rotated around X axis

When KNbO₃ is rotated around Y axis

When KNbO₃ is rotated around Z axis

DISPLACEMENT CONTROL ACTUATOR

BACKGROUND OF THE INVENTION

1. Field of the Invention

The present invention relates to a displacement control actuator which has a relatively large displacement while maintaining the high reliability and is capable of controlling displacement with great precision.

2. Description of the Related Art

Conventional piezoelectric actuators are classified into a linear displacement type and a flexional displacement type: the linear displacement type being classified into a single-plate type and a laminated type, and the flexional displacement type including a bimorph type. Though the linear displacement type piezoelectric actuator, of the laminated type in particular, cannot provide very large displacement, it is used as a fine motion actuator for precision machines, etc. since it can provide strong power. However, this piezoelectric displacement actuator is apt to be an expensive actuator since it is made by laminating a large number of piezoelectric elements and electrodes. Further, the flexional displacement type piezoelectric displacement actuator of the bimorph type is made by bonding mechanical-electrical converter elements to one another and bonding the mechanical-electrical converter elements to metal plates. This actuator is utilized in a large number of fields since it has an extremely large displacement and is inexpensive.

Speaking concretely, a bimorph type mechanical-electrical converter element 50 of the bimorph type actuator is made by bonding piezoelectric ceramic plates 51a and 51b on which electrodes 52a and 52b are formed with a bonding agent 53 such as an epoxy resin as shown in FIG. 28. Further, the bimorph type mechanical-electrical converter element 50 has a cantilever structure wherein an end of the bimorph type mechanical-electrical converter element 50 is bonded and fixed to a fixing member 55 with an electrically conductive bonding agent 54 or the like as shown in FIG. 29. Since resonance frequencies of bimorph type mechanical-electrical converter elements which have the cantilever structure vary from converter element to converter element, these mechanical-electrical converter elements are employed in fields where they are used at low frequencies far from the resonance frequencies and other fields where driving frequencies can be adequately selected for individual converter elements. As an example where a piezoelectric ceramic is used in a light deflector, there is conventionally known a light deflector wherein a mirror is attached to an actuator which is made by laminating piezoelectric elements and a direction of the mirror is changed by applying a voltage to the actuator. (V. J. Fowler & J. Schlafer. Proc. IEEE., VOL. 54 (1966), p. 1437). Due to the fact that the light deflector uses the laminated type actuator, however, it has the drawback that it cannot provide a large deflection angle relative to the applied voltage.

Further, another light deflector (Japanese Patent Laid-Open No. 58-95710) rotates a mirror by utilizing bimorph type actuators. However, this light deflector has the drawback that it has an extremely complicated structure due to the fact that a plurality of bimorph type actuators are coupled mechanically with a rotating shaft of the mirror.

Furthermore, still another light deflector (Japanese Patent Laid-Open No. 58-189618) is configured so as to divide an electrode for piezoelectric elements of a bimorph type actuator into a plurality of sections, and control the deformation degree of the piezoelectric elements by controlling the number of electrodes to which a voltage is applied. However, this light deflector has the drawback that the control of the degree of deflection is complicated.

A precision displacement control actuator which uses such a piezoelectric ceramic poses the problem that it cannot well control a displacement because it exhibits a remarkable non-linearity in relationship between applied voltages and displacements at applied voltages higher than 10% of a breakdown limit, even when the driving frequency is set at a level far lower than the resonance frequency of the piezoelectric elements. Another problem is that the displacement of the precision displacement control actuator is largely variable, since the piezoelectric ceramic per se is manufactured by mixing and burning various material, and has a material constant larger than that of a single crystal material.

Furthermore, such a conventional actuator poses the problem that it reduces displacement since it ordinarily uses, for bonding the piezoelectric ceramic, a bonding agent containing an epoxy resin or the like which has a Young's modulus not exceeding $0.5 \times 10^{10}$ N/m$^2$ far smaller than the Young's modulus of $5 \times 10^{10}$ N/m$^2$ to $15 \times 10^{10}$ N/m$^2$ of the piezoelectric ceramic and absorbs distortion of the mechanical-electrical converter element caused by the application of the driving voltage.

Moreover, such a conventional actuator poses still another problem in that it allows the characteristics of the mechanical-electrical converter element, displacement and resonance frequency, to be variable since it is difficult to bond the piezoelectric ceramic with a layer of the bonding agent having uniform thickness.

For stabilizing the displacement of a rectangular bimorph type piezoelectric converter element, it is additionally necessary to stabilize its resonance frequency. Though it is necessary to stabilize the fixed condition of the mechanical-electrical converter element for this purpose, a portion of the bimorph type mechanical-electrical converter element which is supported or fixed with a supporting or fixing member made of a metal or the like deviates due to stresses produced by mechanical or temperature variations. When the mechanical-electrical converter element is fixed with a bonding agent, for example, its fixed position is changed depending on the application ranges of the bonding agents, thereby varying the resonance frequency of the mechanical-electrical converter element. Further, it is difficult to maintain the stable fixed condition of the mechanical-electrical converter element since the fixed condition varies by temperature the variations of the bonding agent.

The light deflector which utilizes such a mechanical-electrical converter element also poses problems in that it requires a high driving voltage for obtaining a large deflection angle due to the characteristics of the mechanical-electrical converter element described above. Another problem is that it allows a deflection angle of the light deflector to vary markedly.

SUMMARY OF THE INVENTION

The present invention has been achieved for solving the problems in the prior art described above and has as its object to provide a displacement control actuator which has a simple configuration, a large displacement, and extremely small variations in characteristics such as displacement, and which is capable of controlling displacement with high precision.

A displacement control actuator of the first invention comprises: a mechanical-electrical converter element having (1) a piezoelectric element which is bonded by utilizing direct bonding between first main surfaces of at least two piezoelectric substrates each of which has a first main surface and a second main surface opposed to each other and (2) electrodes formed on said second main surfaces of said piezoelectric element; and support members, which support said mechanical-electrical converter element.

The displacement control actuator according to the present invention makes it possible to obtain firm coupling, minimizing loss on the boundary surface between substrates, and maintaining a large displacement.

A displacement control actuator of the third invention according to said first invention is characterized in that the two piezoelectric substrates are bonded so that their axes of polarization are set in directions reverse to each other.

The displacement control actuator according to the present invention allows a large displacement since each piezoelectric substrate effectively excites flexural vibrations.

A displacement control actuator of the fourth invention according to said first invention is characterized in that a buffer layer formed on one of the two piezoelectric substrates is bonded directly to the other of the two piezoelectric substrates.

The displacement control actuator according to the present invention makes it possible to ignore variations in bonded surface conditions and bond materials which can be bonded only with difficulty.

A displacement control actuator of the fifth invention according to said first invention is characterized in that one end of said mechanical-electrical converter element is supported by support members.

The displacement control actuator according to the present invention makes it possible to enhance the displacement takeout efficiency.

A displacement control actuator of the sixth invention according to said first invention is characterized in that said piezoelectric substrate is made of a single crystal piezoelectric material having a crystallographic structure of the 3 m family, that the main surface of said piezoelectric substrate is perpendicular to an axis which intersects with a Y axis at an angle of +129° to +152° and includes an X axis when crystallographic axes of said single crystal piezoelectric material are taken as X, Y and Z axes, and that a straight line traced from the center of gravity of said piezoelectric substrate to the center of the support members is perpendicular to said X axis.

The displacement control actuator according to the present invention makes it possible to maintain a large displacement while suppressing variations of the displacement at a low level.

A displacement control actuator of the seventh invention according to said first invention is characterized in that said piezoelectric substrate is made of a single crystal piezoelectric material having a crystallographic structure of the 3 m family, that the main surface of said piezoelectric substrate is perpendicular to an axis which intersects with a Y axis at an angle of −26° to +26° and includes an X axis when crystallographic axes of said single crystal piezoelectric material are taken as X, Y and Z axes, and that a straight line traced from the center of gravity of said piezoelectric substrate to the center of the support members is in parallel with said X axis.

A displacement control actuator of the eighth invention according to said first invention is characterized in that said piezoelectric substrate is made of a single crystal piezoelectric material having a crystallographic structure of the 32 family, that the main surface of said piezoelectric substrate is perpendicular to an X axis when crystallographic axes of said single crystal piezoelectric material are taken as X, Y and Z axes, and that a straight line traced from the center of gravity of said piezoelectric substrate to a center of the support members intersects with said Z axis at an angle of +52° to +86°.

A displacement control actuator of the ninth invention according to the said first invention is characterized in that said piezoelectric substrate is made of a single crystal piezoelectric material having a crystallographic structure of the 32 family, that the main surface of said piezoelectric substrate is perpendicular to an axis which intersects with an X axis at an angle of −26° to +26° and includes a Y axis when crystallographic axes of said single crystal piezoelectric material are taken as X, Y and Z axes, and that a straight line traced from the center of gravity of said piezoelectric substrate to a center of the support members is in parallel with said Y axis.

A displacement control actuator of the tenth invention according to said first invention is characterized in that said piezoelectric substrate is made of a single crystal piezoelectric material having a crystallographic structure of the 32 family, that the main surface of said piezoelectric substrate is perpendicular to an axis which intersects with an X axis at an angle of +82° to +98° and includes a Z axis when crystallographic axes of said single crystal piezoelectric material are taken as X, Y and Z axes, and that a straight line traced from a center of gravity of said piezoelectric substrate to a center of the support members is perpendicular to said Z axis.

A displacement control actuator of the eleventh invention according to said first invention is characterized in that said piezoelectric substrate is made of a single crystal piezoelectric material having a crystallographic structure of the 4 mm family, that the main surface of said piezoelectric substrate is perpendicular to an axis which intersects with a Y axis at an angle of +22° to +41° and includes an X axis when crystallographic axes of said single crystal piezoelectric material are taken as X, Y and Z axes, and that a straight line traced from the center of gravity of said piezoelectric substrate to a center of the support members is perpendicular to said X axis.

A displacement control actuator of the twelfth invention according to said first invention is characterized in that said piezoelectric substrate is made of a single crystal piezoelectric material having a crystallographic structure of the 4 mm family, that the main surface of said piezoelectric substrate is perpendicular to an axis which intersects with a Z axis at an angle of +49° to +68° and includes a Y axis when crystallographic axes of said single crystal piezoelectric material are taken as X, Y and Z axes, and that a straight line traced from the center of gravity of said piezoelectric substrate to a center of the support members is perpendicular to said Y axis.

A displacement actuator of the thirteenth invention according to said first invention is characterized in that said piezoelectric substrate is made of a single crystal piezoelectric material having a crystallographic structure of the 4 mm family, and that the main surface of said piezoelectric substrate is perpendicular to a Z axis when crystallographic axes of said single crystal piezoelectric material are taken as X, Y and Z axes.

A displacement control actuator of the fourteenth invention according to said first invention is characterized in that said piezoelectric substrate is made of a single crystal piezoelectric material having a crystallographic structure of the 6 mm family, that the main surface of said piezoelectric substrate is perpendicular to an axis which intersects with a Y axis at an angle of +23° to +51° and includes an X axis when crystallographic axes of said single crystal piezoelectric material are taken as X, Y and Z axes, and that a straight line traced from a center of gravity of said piezoelectric substrate to a center of the support members is perpendicular to said X axis.

A displacement control actuator of the fifteenth invention according to said first invention is characterized in that said piezoelectric substrate is made of a single crystal piezoelectric material having a crystallographic structure of the 6 mm family, that the main surface of said piezoelectric substrate is perpendicular to an axis which intersects with a Z axis at an angle of +46° to +66° and includes a Y axis when crystallographic axes of said single crystal piezoelectric material are taken as X, Y and Z axes, and that a straight line traced from the center of gravity of said piezoelectric substrate to a center of the support members is perpendicular to said Y axis.

The displacement control actuator according to the present invention makes it possible to ignore variations in bonded surface conditions and bond materials which makes bonding difficult.

A displacement control actuator of the sixteenth invention comprises: a mechanical-electrical converter element having (1) a piezoelectric element bonded by utilizing direct bonding between first main surfaces of at least two piezoelectric substrates each of which has a first main surface and a second main surface opposed to each other, and (2) electrodes formed on said second main surfaces respectively of said piezoelectric element; and support members which support said mechanical-electrical converter element, wherein said mechanical-electrical converter element is bonded to said support members by utilizing direct bonding.

A displacement control actuator of the seventeenth invention according to said sixteenth invention, is characterized in that said piezoelectric substrates, which compose said mechanical-electrical converter element, and said support members, are directly bonded by coupling atoms composing said piezoelectric substrates and atoms composing said support members with one another by way of at least one selected from among groups composed of oxygen and a hydroxyl group.

The displacement control actuator according to the present invention makes it possible to obtain a firm coupling, minimize conditional variations on a bonded surface, and reduce variations of displacement in any environment.

A displacement control actuator of the eighteenth invention according to said sixteenth invention is characterized in that said piezoelectric substrates and said support members are made of the same material.

The displacement control actuator according to the present invention makes it possible to reduce conditional variations on the bonded surface and variations of displacement.

A displacement control actuator of the nineteenth invention comprises: a mechanical-electrical converter element having (1) a piezoelectric element bonded by utilizing direct bonding between first main surfaces of at least two piezoelectric substrates each of which has a first main surface and a second main surface opposed to each other and (2) electrodes formed on said second main surfaces respectively of said piezoelectric element; and support members which support said mechanical-electrical converter element, wherein said mechanical-electrical converter element is bonded to said support members by utilizing direct bonding, and wherein a reflecting plate is attached to a free end of said mechanical-electrical converter element.

A displacement control actuator of the twentieth invention comprises: a mechanical-electrical converter element having (1) a piezoelectric element bonded by utilizing direct bonding between first main surfaces of at least two piezoelectric substrates each of which has a first main surface and a second main surface opposed to each other and (2) electrodes formed on said second main surfaces respectively of said piezoelectric element; and support members which support said mechanical-electrical converter element, wherein said mechanical-electrical converter element is bonded to said support members by utilizing direct bonding, and wherein one of the piezoelectric substrates which compose said piezoelectric element is longer than the other piezoelectric substrate, and wherein a reflecting film is formed on a surface of a portion of said longer piezoelectric substrate which protrudes from a tip of said other piezoelectric substrate.

A displacement control actuator of the twenty-first invention comprises: a mechanical-electrical converter element having (1) a piezoelectric element bonded by utilizing direct bonding between first main surfaces of at least two piezoelectric substrates each of which has a first main surface and a second main surface opposed to each other and (2) electrodes formed on said second main surfaces respectively of said piezoelectric element; and support members which support said mechanical-electrical converter element, wherein said mechanical-electrical converter element is bonded to said support members by utilizing direct bonding, and wherein a reflecting film is formed on the surface of said piezoelectric substrate.

A displacement control actuator of the twenty-second invention according to said nineteenth, twentieth or twenty-first invention is characterized in that said piezoelectric substrates, which compose said mechanical-electrical converter element, and said support members, are directly bonded by coupling atoms composing said piezoelectric substrates and atoms composing said support members with one another by way of at least one selected from among groups composed of oxygen and a hydroxyl group.

The displacement control actuator according to the present invention makes it possible to obtain a firm coupling, minimize conditional variations on a bonded surface, and reduce variations of displacement in any environment.

A displacement control actuator of the twenty-third invention according to said sixteenth, nineteenth, twentieth or twenty-first invention, is characterized in that a buffer layer formed on said piezoelectric substrate is directly bonded to said support members, or a buffer layer formed on said support members is directly bonded to said piezoelectric substrate.

The displacement control actuator according to the present invention makes it possible to ignore variations in bonded surface conditions and bond materials which makes bonding difficult.

A displacement control actuator of the twenty-fourth invention according to said nineteenth, said twentieth or said twenty-first invention is characterized in that said piezoelectric substrates and said support members are made of the same material.

The displacement control actuator according to the present invention makes it possible to reduce conditional variations on the bonded surface and variations of displacement.

A displacement control actuator of the twenty-fifth invention according to said twenty-first invention is characterized in that all or part of said electrodes serve as a reflecting film.

The displacement control actuator according to the present invention can have a simpler configuration.

The configuration described above makes it possible to offer to the market a displacement control actuator which has a simple composition, a large displacement, small variations of characteristics such as displacement, and which is capable of controlling displacement with high precision.

BRIEF DESCRIPTION OF THE DRAWINGS

FIG. 1 is a perspective view illustrating a mechanical-electrical converter element which is to be used in a precision displacement control actuator preferred as a first embodiment of the present invention;

FIG. 3 is a perspective view illustrating another example of a mechanical-electrical converter element which is to be used in the precision displacement control actuator preferred as the first embodiment of the present invention;

FIG. 4 is a perspective view illustrating the precision displacement control actuator preferred as the first embodiment of the present invention;

DESCRIPTION OF THE REFERENCE NUMERALS

Figure 2A:
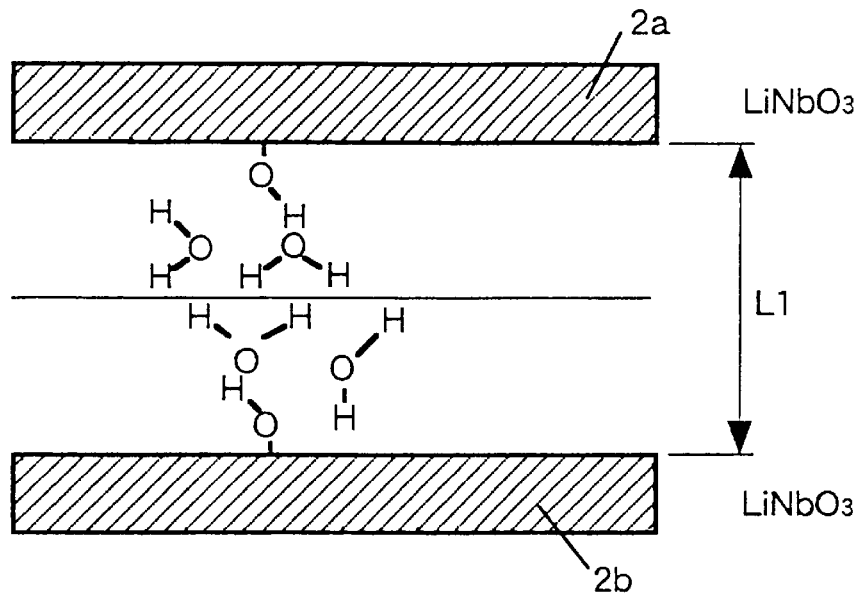
FIGS. 2(A) through 2(C) are diagrams descriptive of interface conditions of piezoelectric substrates at various direct bonding steps of a manufacturing method of the mechanical-electrical converter element which is to be used in the precision displacement control actuator preferred as the first embodiment of the present invention.

1 . . . mechanical-electrical converter element
2a, 2b . . . piezoelectric substrate
3a, 3b . . . electrode
4a, 4b . . . support member
5a . . . reflecting plate
5b . . . reflection film
46 . . . buffer layer
100 . . . precision displacement control actuator

DETAILED DESCRIPTION OF THE PREFERRED EMBODIMENTS

Now, the present invention will be described in more detail with reference to the preferred embodiments.
(First Embodiment)

FIG. 1 is a perspective view illustrating a mechanical-electrical converter element which is to be used in the precision displacement actuator preferred as the first embodiment of the present invention. Rectangular piezoelectric substrates 2a and 2b each of which has two main surfaces opposed to each other, measures 50 μm thick by 1 mm wide by 8 mm long and is made of lithium niobate ($LiNbO_3$), are bonded directly to each other on the main surfaces as shown in FIG. 1, thereby composing a piezoelectric element 2. The piezoelectric substrate 2a and the piezoelectric substrate 2b are bonded so that their axes of polarization are set in directions reverse to each other. Electrodes 3a and 3b which are 0.2 μm thick and made of chromium-nickel are formed on the main surfaces of the piezoelectric element 2 which are opposed to each other. Accordingly, a bimorph type mechanical-electrical converter element 1 is composed.

An example of a method for manufacturing a mechanical-electrical converter element which has such a composition as that described above will be described below.

Figure 2B:
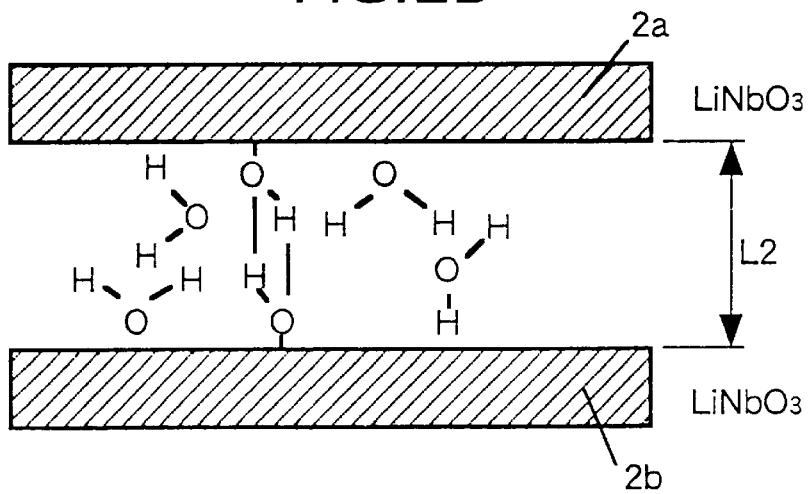
Figure 2C:
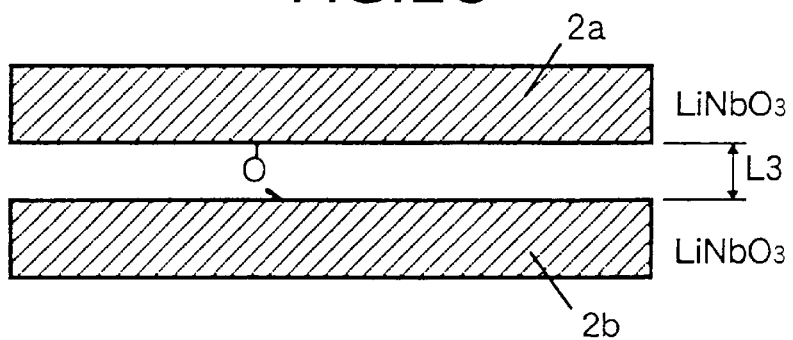

FIGS. 2(A) through 2(C) are diagrams descriptive of interface conditions of the piezoelectric substrates at different stages of the direct bonding of the manufacturing method of a mechanical-electrical converter element which is to be used in a precision displacement control actuator preferred as the first embodiment of the present invention. In FIGS. 2(A) through 2(C), reference symbols $L_1$, $L_2$ and $L_3$ represent distances between the piezoelectric substrates. First, both surfaces of each of two $LiNbO_3$ substrates which were to be used as the piezoelectric substrates 2a and 2b were polished into mirror surfaces. Then, the piezoelectric substrates 2a and 2b were washed with a mixture liquid of ammonia, hydrogen peroxide and water (ammonia water:hydrogen peroxide:water=1:1:6 (by volume)) for making them hydrophilic. The surfaces of the piezoelectric substrates 2a and 2b which were washed with the mixture liquid were terminated by hydroxyl groups (—OH groups) as shown in FIG. 2(A) and became hydrophilic (a condition before bonding).

Then, the two piezoelectric substrates ($LiNbO_3$) 2a and 2b which were made hydrophilic were bonded so that their axes of polarization are set in directions reverse to each other ($L_1 > L_2$) as shown in FIG. 2(b).

Accordingly, dehydration took place, whereby the piezoelectric substrates ($LiNbO_3$) 2a and 2b attracted and bonded to each other due to attractions produced by —OH polymerization and hydrogen bonding.

Successively, the piezoelectric substrates ($LiNbO_3$) 2a and 2b which were bonded as described above were subjected to a heat treatment at a temperature of 450° C. By this heat treatment, atoms composing the piezoelectric substrate ($LiNbO_3$) 2a and atoms composing the piezoelectric substrate ($LiNbO_3$) were set in a condition of covalent bond ($L_2 > L_1$) by way of oxygen (O) as shown in FIG. 2(C), whereby the piezoelectric substrates 2a and 2b were bonded firmly and directly. In other words, a bonded condition where no layer of a bonding agent or the like is present on the bonding interface was obtained. Alternatively, the atoms composing the piezoelectric substrate ($LiNbO_3$) 2a and the atoms composing the piezoelectric substrate ($LiNbO_3$) 2b may be, in certain cases, set in a condition of covalent bond by way of hydroxyl groups, whereby the piezoelectric substrates 2a and 2b are bonded firmly and directly at an atomic level.

Since $LiNbO_3$ has a Curie point at 1210° C. and its characteristic is degraded due to a temperature history, it is desirable to select a heat treatment temperature lower than the Curie point.

By the way, bonding which is caused directly between interfaces by way of no binding layer, such as a bonding agent, by treating surfaces polished into mirrors surfaces of members to be bonded and bringing them into contact, is referred to as "direct bonding". Strong bonding such as bonding due to inter-molecular forces, covalent bonding or ion bonding on an atomic level is generally obtained by a heat treatment.

Successively, the electrodes 3a and 3b were formed on the two main surfaces of the directly bonded piezoelectric substrates ($LiNbO_3$) 2a and 2b, i.e., the piezoelectric element 2, by vapor deposition of nickel-chromium (see FIG. 1). Finally, a bimorph type mechanical-electrical converter element 1 was manufactured by cutting the piezoelectric element into a rectangle having a predetermined size using a dicing saw.

It is possible to bond a buffer layer 46 composed of a thin film of silicon oxide or the like directly to one of the piezoelectric substrates and bond the piezoelectric substrate to the other piezoelectric substrate as shown in FIG. 3. Speaking more concretely, the atoms composing the piezoelectric substrate 2b and atoms composing the buffer layer 46 are bonded by way of oxygen or hydroxyl groups, by bonding the buffer layer 46 which is 0.1 μm thick and composed of the thin film of silicon oxide, directly to one of the main surfaces of the piezoelectric substrate 2a, subjecting the buffer layer 46 and the other piezoelectric substrate 2b to the treatment for the hydrophilic nature, and performing the heat treatment of both the members in an overlapped condition.

Even when the surfaces which are to be bonded have undulations, concavities and convexities or when foreign particles such as dust are adhering to the surfaces which are to be bonded, the buffer layer 46 absorbs the irregularities such as the concavities and convexities, thereby facilitating bonding of the surfaces.

Further, even when materials to be bonded having surfaces on which oxygen or hydroxyl groups are difficult to produce by the treatment for hydrophilic nature, the direct bonding of the buffer layer 46 facilitates the bonding of these materials. In this case, the buffer layer 46 may be bonded to either or both the surfaces to be bonded.

In addition to silicon oxide, silicon nitrate and metallic silicate, for example, can also be used as materials for the buffer layer.

Though the embodiment described above is for a case where the buffer layer 46 is bonded directly to one of the piezoelectric substrates, the present invention is not limited to that embodiment. The displacement control actuator according to the present invention may have a structure wherein the buffer layer 46 is formed on one of the piezoelectric substrates using a film forming technique, and the buffer layer on the piezoelectric substrate is bonded directly to the other piezoelectric substrate. This composition makes it possible to bond, by way of a buffer layer, a combination of piezoelectric substrates which are difficult to bond directly, and provides a concomitant effect to broaden the range within which materials for piezoelectric substrates are selectable.

(Second Embodiment)

Figure 5:
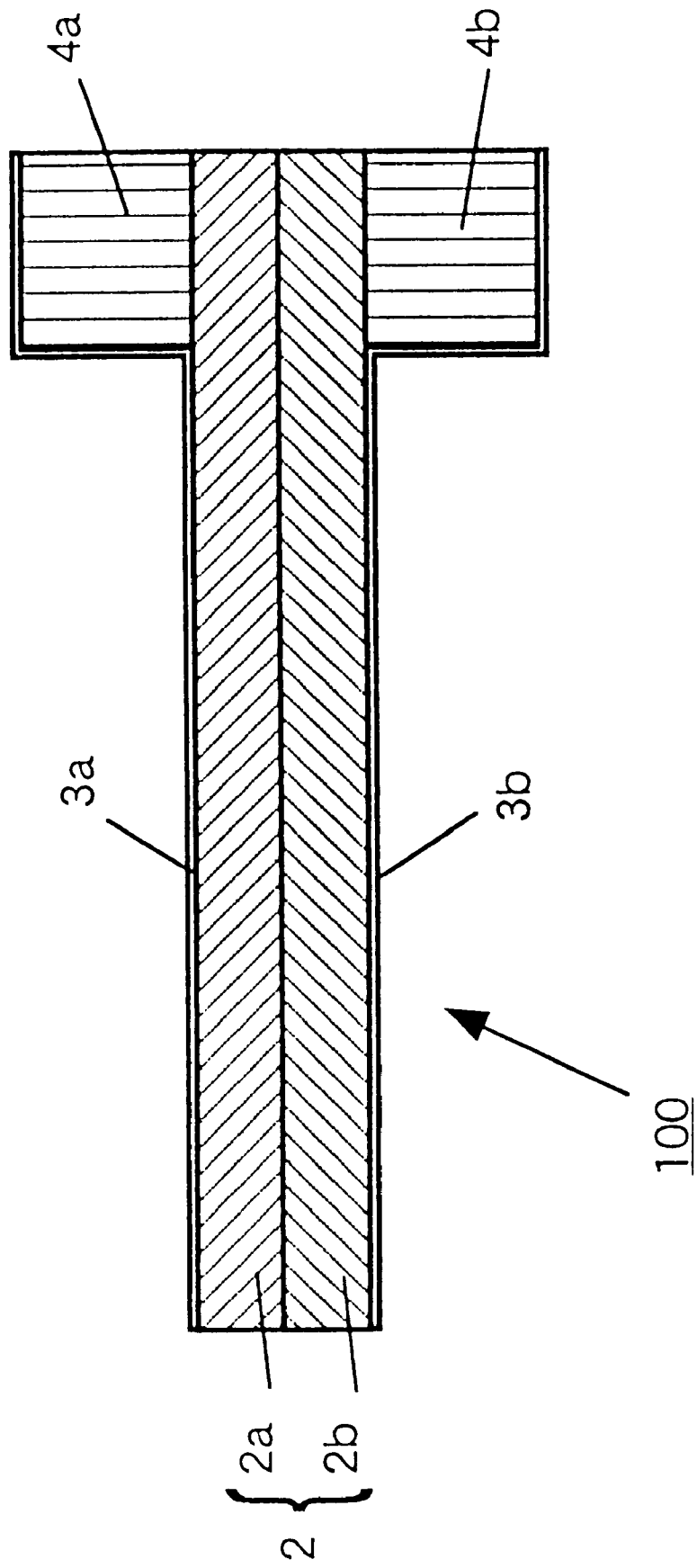
FIG. 5 is a sectional view illustrating the precision displacement control actuator or preferred as the first embodiment of the present invention.
Figure 27:
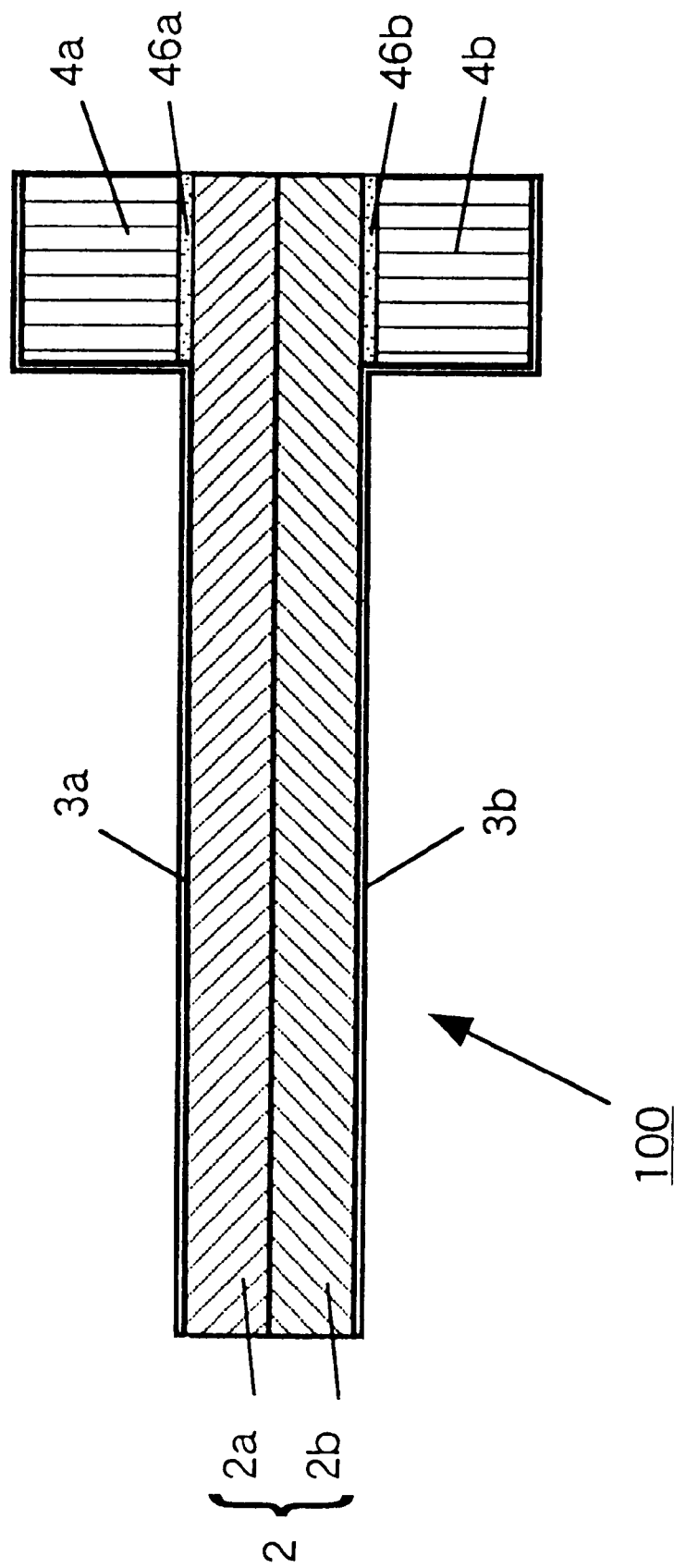
FIG. 27 is a sectional view illustrating a displacement control actuator preferred as the second embodiment of the present invention.
Figure 28:
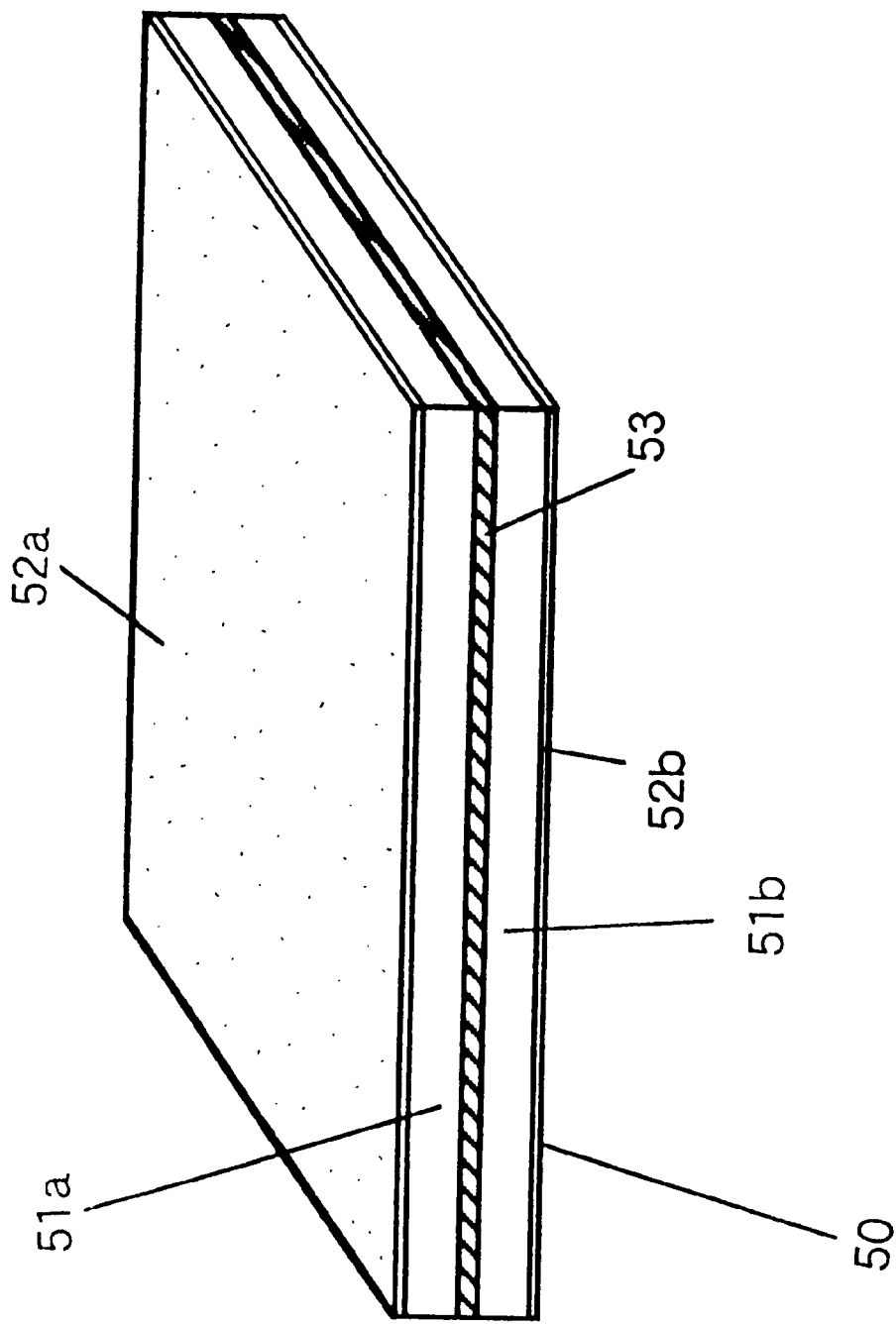
FIG. 28 is a perspective view illustrating a bimorph type mechanical-electrical converter element according to the prior art.
Figure 29:
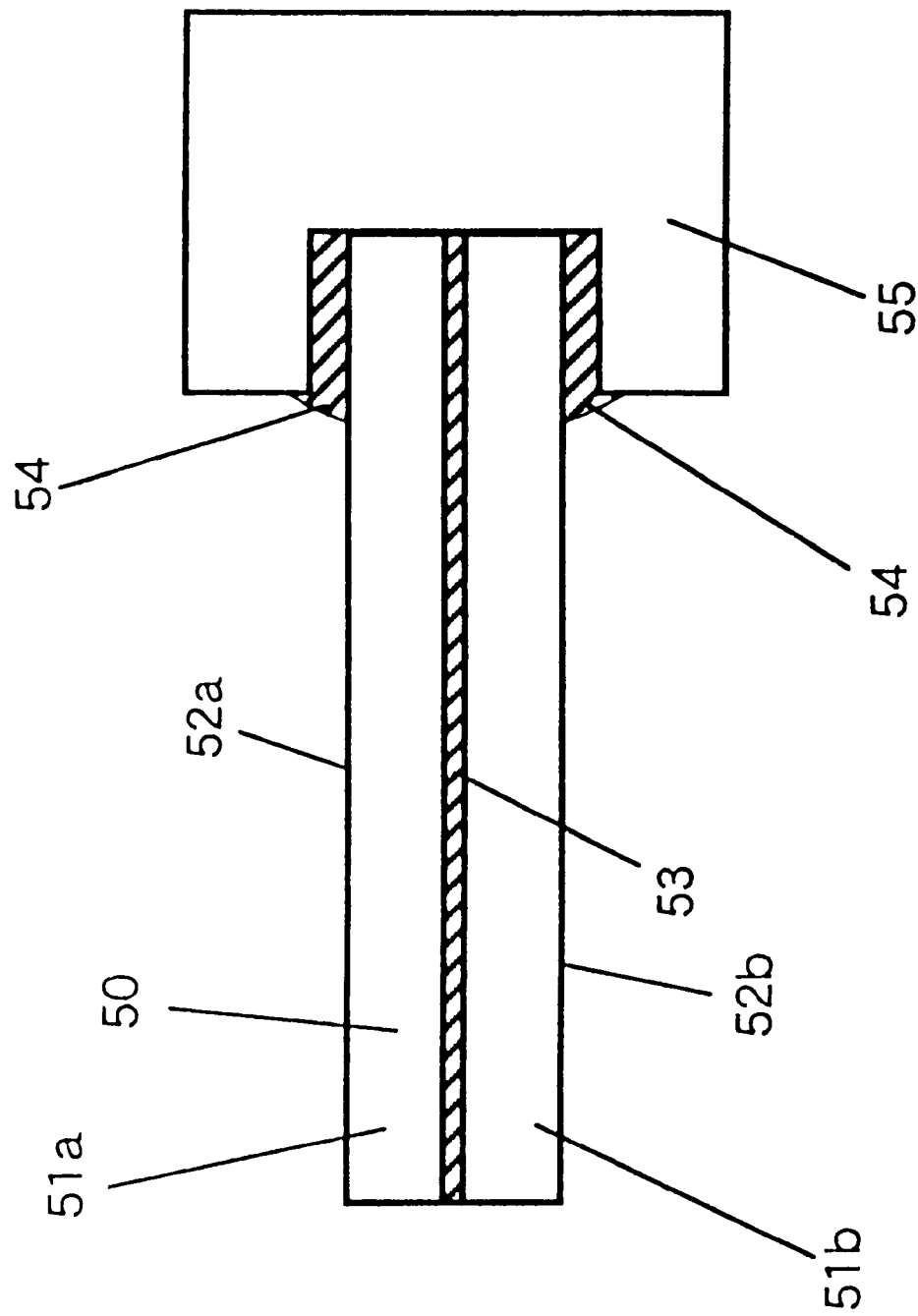
FIG. 29 is a sectional view illustrating a bimorph type actuator having a cantilever structure according to the prior art.

FIG. 4 is a perspective view illustrating a precision displacement control actuator preferred as a second embodiment of the present invention, and FIG. 5 is a sectional view illustrating this embodiment. Two rectangular piezoelectric substrates 2a and 2b, each of which has two main surfaces opposed to each other, measures 50 μm thick by 1 mm wide by 8 mm long and is made of $LiNbO_3$, are bonded to each other directly on the main surfaces, thereby composing a mechanical-electrical converter element 1 as shown in FIG. 4 and FIG. 5. The piezoelectric substrate 2a and the piezoelectric substrate 2b are bonded so that their axes of polarization are set in directions reverse to each other. One end of the mechanical-electrical converter element 1 is fixed in a condition where it is sandwiched and held between support members 4a and 4b made of $LiNbO_3$. In this embodiment, the mechanical-electrical converter element 1 is bonded directly to the support members 4a and 4b. In this case, the bonding between the mechanical-electrical converter element 1 and the support members 4a, 4b may be a direct bonding which is made by way of a buffer layer composed, for example, of a film of silicon oxide as shown in FIG. 27. Electrodes 3a and 3b made of chromium-nickel 0.2 μm thick are formed on the two main surfaces respectively of the mechanical-electrical converter element 1, and these electrodes 3a and 3b are formed so as to be continuous over the support members 4a and 4b for facilitating taking out the electrodes. The precision displacement control actuator 100 is composed as described above.

Figure 6:
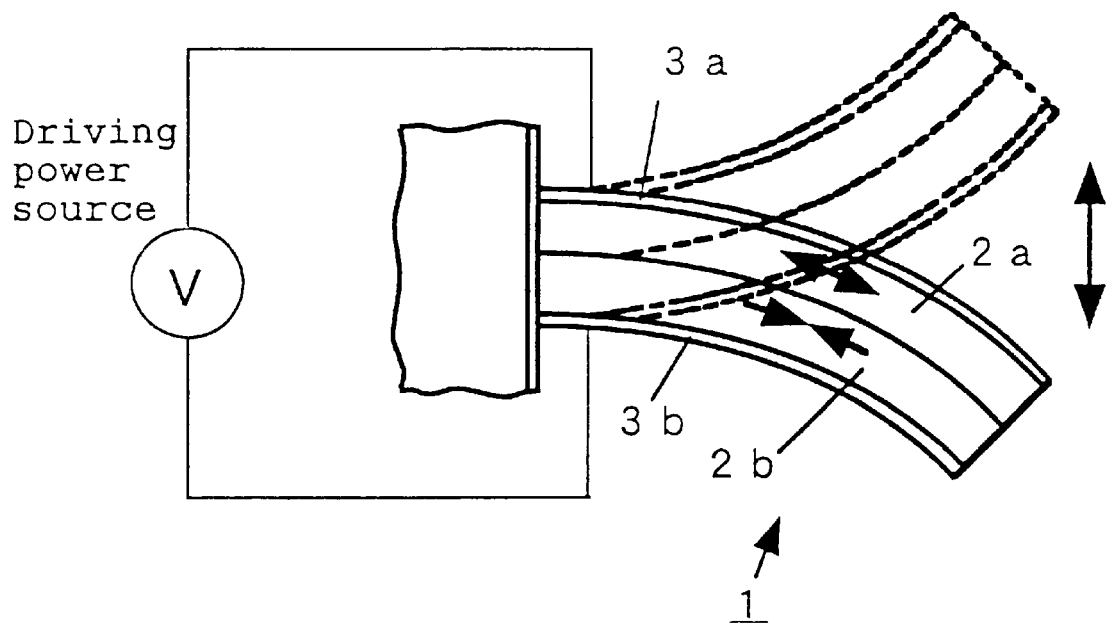
FIG. 6 is a diagram descriptive of a manner to excite flexural vibrations of a bimorph type mechanical-electrical converter element which has a cantilever structure in the first embodiment of the present invention.

In the precision displacement control actuator 100 shown in FIG. 4, driving signals are applied between the electrodes 3a and 3b of the mechanical-electrical converter element 1 which are made of $LiNbO_3$ or the like, and since the piezoelectric substrate 2a and the piezoelectric substrate 2b are bonded so that their axes of polarization are set in the directions reverse to each other, an elongating strain or a contracting strain is produced in the piezoelectric substrate 2a and a reverse strain is produced in the piezoelectric substrate 2b. Accordingly, the mechanical-electrical converter element 1 is excited to flexural vibrations around the end supported by the support members 4a and 4b (see FIG. 6).

The second embodiment exhibits an excellent linearity of displacement relative to an applied voltage, owing to the fact that it uses the piezoelectric substrates 2a and 2b which are made of $LiNbO_3$ having a stable voltage characteristic. Speaking concretely, the embodiment exhibits the linearity up to 85% or higher of the breakdown limit (see FIG. 19). As a result, the second embodiment makes it possible to obtain a precision displacement control actuator which has high controllability. In contrast, the linearity of the conventional mechanical-electrical converter element which utilizes the conventional piezoelectric ceramic substrates is limited to 10% of the breakdown limit (see FIG. 20). Furthermore, variations of displacement of the precision displacement control actuator are small since the second embodiment uses the piezoelectric substrates 2a and 2b made of $LiNbO_3$, a material which varies little.

In case of the conventional mechanical-electrical converter element which is manufactured by bonding the piezoelectric ceramic substrates with a bonding agent, on the other hand, a bonding agent which is softer than the piezoelectric substrate is interposed between the piezoelectric substrates a strain produced in each piezoelectric substrate by applying a driving signal to the mechanical-electrical converter element is absorbed by the bonding agent and a strain effective for producing deflection is reduced. Accordingly, the mechanical-electrical converter element is excited to flexural vibrations having a smaller amplitude.

In the mechanical-electrical converter element 1 of the second embodiment, which is manufactured by directly bonding the piezoelectric substrates 2a and 2b, however, no bonding layer such as a bonding agent exists between the piezoelectric substrates 2a and 2b. In other words, strains which are produced in the piezoelectric substrates 2a and 2b by applying the driving signal are absorbed by nothing and converted into flexural vibrations with no loss. As a result, the second embodiment makes it possible to obtain a precision displacement control actuator which has a large displacement.

Moreover, the vibration characteristics of the mechanical-electrical converter element 1 are not changed due to temperature variations since a bonding layer is not present between the piezoelectric substrates 2a and 2b.

In addition, variations in resonance frequency and in displacement of the mechanical-electrical converter element 1 are reduced to extremely low levels since the piezoelectric substrates 2a and 2b are bonded in a uniform condition.

When a thickness direction and a longitudinal direction of the $LiNbO_3$ substrate are set in directions of the Y' axis and the Z' axis respectively, on the other hand, a compressive stress and a tensile stress act in the direction of the Z' axis, whereas electric charges are produced in the direction of the Y' axis. In this case, the amount of electric charged to be produced is largely dependent on a piezoelectric constant $d_{23}'$. A value of this piezoelectric constant $d_{23}'$ is largely varied dependent on the directions of the Y' axis and the Z' axis relative to the crystallographic axes. That is, the displacement of the precision displacement control actuator is largely varied dependent on the directions of the Y' axis and the Z' axis. A precision displacement control actuator which has the largest displacement is obtained when the Y' axis and the Z' axis are adequately set and a cut angle is selected so that the piezoelectric constant $d_{23}'$ has a largest absolute value.

Figure 7:
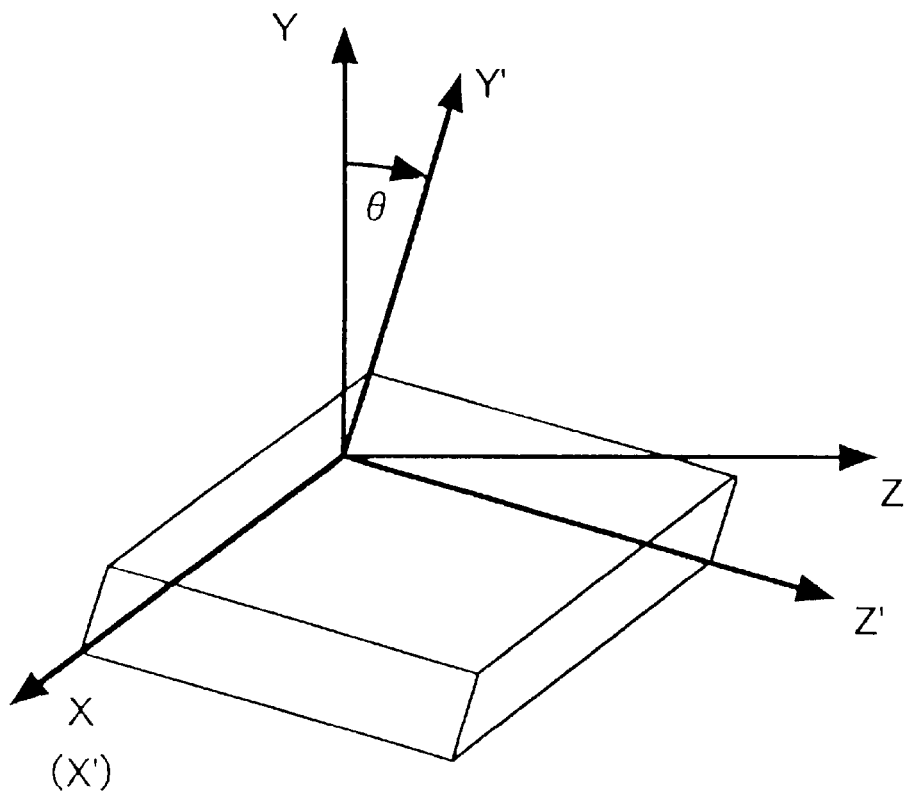
FIG. 7 is a diagram illustrating the relationship between crystallographic axes and cut angle of a piezoelectric substrate.

FIG. 7 visualizes the relationship between the crystallographic axis of the $LiNbO_3$ substrates and a cut angle. In FIG. 7, the X axis, Y axis and Z axis represent crystallographic axes of the $LiNbO_3$ substrate, and the X' axis (=X axis), Y' axis and Z' axis designate axes which intersect perpendicularly to one another when the Y axis is turned at an angle θ around the X axis. In other words, the X' axis (=X axis), Y' axis and Z' axis represent cut directions of the $LiNbO_3$ substrate. When a thickness direction and a longitudinal direction of the substrate are taken as the directions of the X' axis and Y' axis respectively after setting directions of the axes as shown in FIG. 7, a displacement of the precision displacement control actuator is largely dependent on a piezoelectric constant $d_{12}'$.

When the thickness direction and the longitudinal direction of the $LiNbO_3$ substrate are taken as the directions of the X' axis and Z' axis respectively, the displacement of the precision displacement control actuator is largely dependent on a piezoelectric constant $d_{13}'$.

When the thickness direction and the longitudinal direction of the $LiNbO_3$ substrate are taken as the directions of the Y' axis and X' axis respectively, the displacement of the precision displacement control actuator is largely dependent on a piezoelectric constant $d_{21}'$.

When the thickness direction and the longitudinal direction of the $LiNbO_3$ substrate are taken as the directions of the Y' axis and Z' axis respectively, the displacement of the precision displacement control actuator is largely dependent on a piezoelectric constant $d_{23}'$.

When the thickness direction and the longitudinal direction of the $LiNbO_3$ substrate are taken as the directions of the Z' axis and X' axis respectively, the displacement of the precision displacement control actuator is largely dependent on a piezoelectric constant $d_{31}'$.

When the thickness direction and the longitudinal direction of the $LiNbO_3$ substrate are taken as the directions of the Z' axis and Y' axis respectively, the displacement of the precision displacement control actuator is largely dependent on a piezoelectric constant $d_{32}'$.

Figure 8:
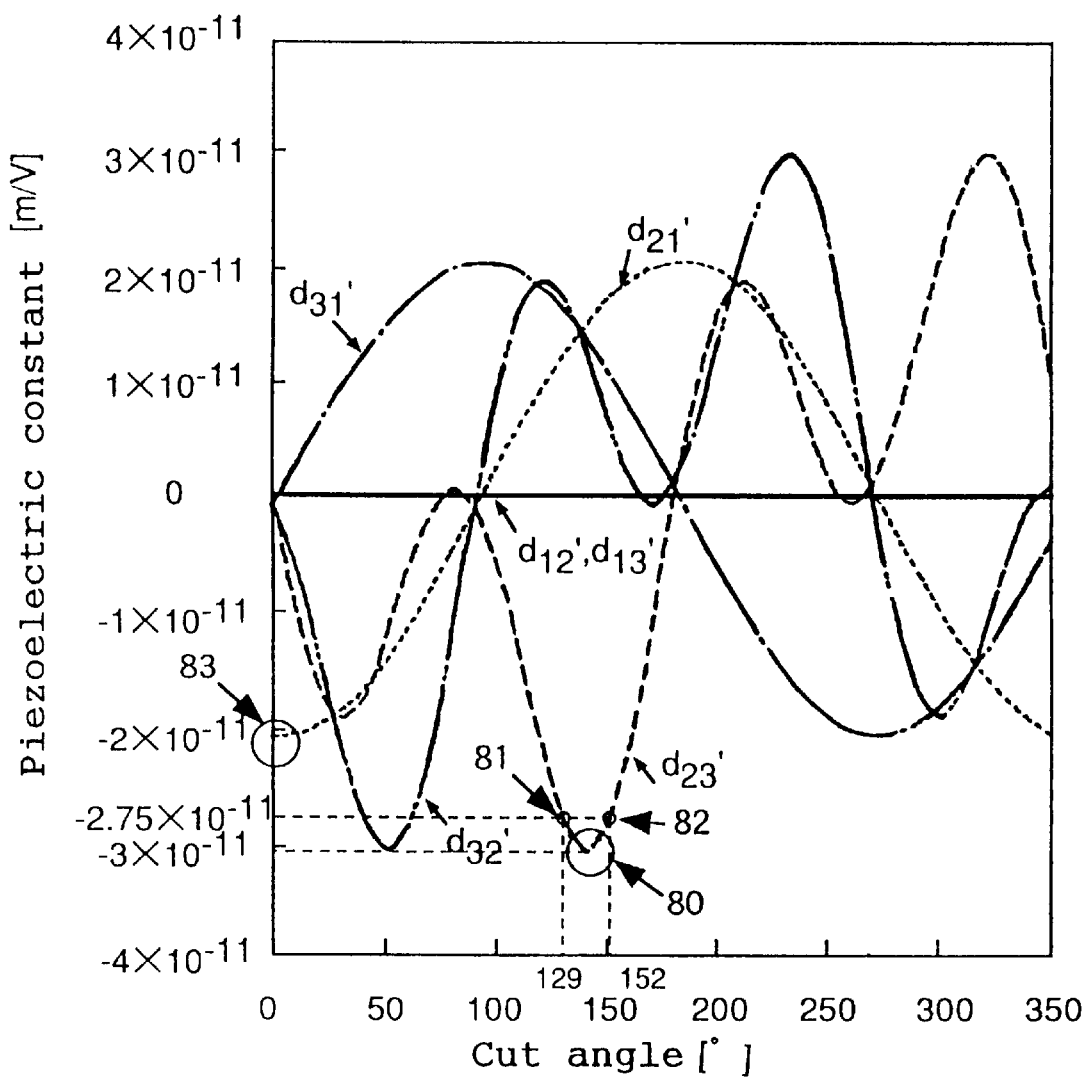
FIG. 8 is a diagram illustrating the relationship between cut angles and piezoelectric constants of an $LiNbO_3$ substrate.

FIG. 8 visualizes the relationship between cut angles of a $LiNbO_3$ substrate and the piezoelectric constants. The piezoelectric constant $d_{23}'$ has the largest value at a cut angle of 140° as shown in FIG. 8. Experimental results which were obtained by actually manufacturing precision displacement control actuators at various cut angles are summarized in the following table (Table 1) and FIG. 9.

TABLE 1

| Cut angle | Direction of length | Piezoelectric constant [c/N] | Displacement [mm/100 V-DC] |
|---|---|---|---|
| Y-cut 135° | Z' direction | $-2.99 \times 10^{-11}$ | 0.031 |
| Y-cut 140° | Z' direction | $-3.06 \times 10^{-11}$ | 0.032 |
|  | X direction | $1.53 \times 10^{-11}$ | 0.016 |
| Z-cut 0° | X direction | 0.0 | No vibration |

As shown in the above table, it has been confirmed that a precision displacement control actuator using substrates which have Y-cut of 140° provides the largest piezoelectric constant and a longitudinal direction set in the direction of the Z' axis has the largest displacement.

Figure 10:
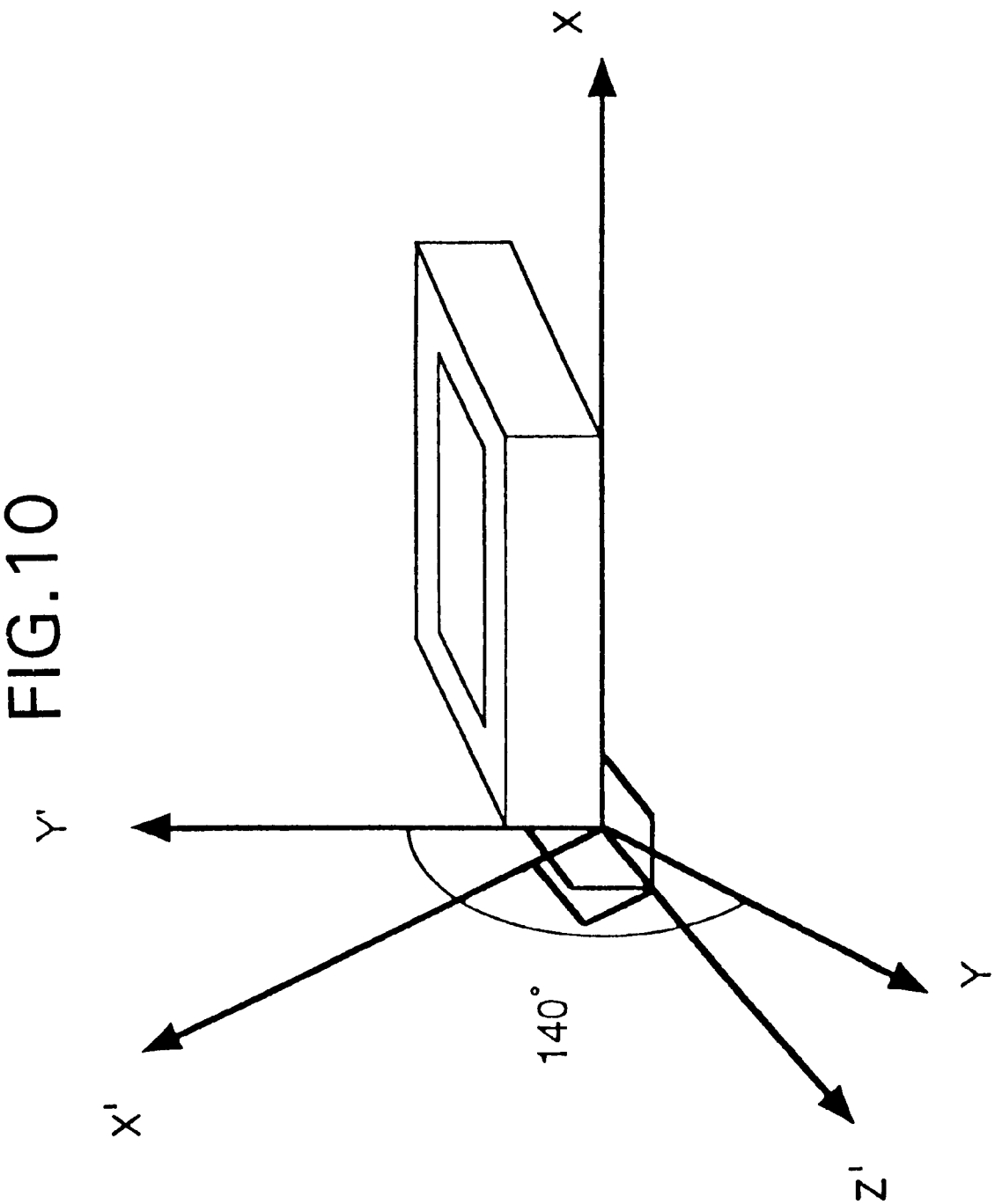
FIG. 10 is a diagram illustrating a cut angle of the precision displacement control actuator preferred as the first embodiment of the present invention.

FIG. 10 illustrates the relationship at the cut angle of the precision displacement control actuator at that time. The precision displacement control actuator exhibited the largest displacement when the Y axis is turned 140° around the X axis, electrodes are disposed on a plane perpendicular to the Y' axis and the longitudinal direction is set in the direction of the Z' axis as shown in FIG. 10.

$LiNbO_3$ has a crystallographic structure which is 3 m of the family of the trigonal system and has three symmetrical structures around the Z axis. Therefore, there are a plurality of cut angles which provide the same piezoelectric constants. As shown in FIG. 8, for example, the piezoelectric constant $d_{32}'$ at cut angles of 50° and 230° has a value which is the same as that of the piezoelectric constant $d_{23}'$ at cut angles of 140° and 320°. This is clear from the symmetry of the crystal.

At cut angles in the vicinities of cut angles at which displacement is largest, the piezoelectric constants are less dependent on cut angles and displacements which are substantially the same are obtained without strictly optimalizing cut angles. When attempts are made to strictly optimize cut angles, the greater precision required for the stricter specifications of the cut angles and steps for reducing variations, result in a higher cost per unit.

One of the targets of the present invention is to develop a device which allows very small variations by using a material having small variations of a piezoelectric constant such as a single crystal. As a compromise between cost of manufacture and performance, this specification selects a range of 90% and higher of a maximum value of a piezoelectric constant as a range wherein variations in the piezoelectric constant are allowable when a maximum value of the piezoelectric constant is taken as 100%.

Speaking of the piezoelectric constant $d_{23}'$ an optimum cut angle lies at 140° as shown in FIG. 8, but the piezoelectric constant has a maximum value of 90% at cut angles of 129° (indicated by 81 in FIG. 8) and 152° (indicated by 82 in FIG. 8). Accordingly, the piezoelectric constant has values within a range from 90 to 100% of the maximum value so far as a cut angle is within a range from 129° to 152°, thereby posing no problem due to degradation of displacement. When the thickness direction and the longitudinal direction of the $LiNbO_3$ substrate are set in the directions of the Y' axis and X axis respectively, displacement of the precision displacement control actuator is dependent on the piezoelectric constant $d_{21}'$. The piezoelectric constant $d_{21}'$ is less dependent on a cut angle than the piezoelectric constant $d_{23}'$ as shown in FIG. 8. In this case, however, the piezoelectric constant has a value within a range from 90 to 100% of the maximum value and is very lowly dependent on a cut angle, thereby posing no problem due to variations of displacement so far as a cut angle is within a range from −26° to +26°.

Accordingly, the working cost is low since it is possible to manufacture a precision displacement control actuator without finishing the cut angle with high precision. Though a smaller difference between cut angles of the two piezoelectric substrates is preferable from a viewpoint of a problem that electric charges produced due to the pyroelectric effect of the piezoelectric substrates are not cancelled when cut angles of the two piezoelectric substrates are largely different, a difference within 1° is allowable between the cut angles of the two piezoelectric substrates which compose a mechanical-electrical converter element since the piezoelectric constant is not dependent largely on cut angles.

Since the piezoelectric substrates 2a and 2b made of the $LiNbO_3$ single crystal which has a stable piezoelectric characteristic are used, the constants, the piezoelectric constant and elastic constant in particular, are stable regardless of variations of electric charges applied to the substrates, whereby the second embodiment exhibits an excellent linearity relative to a voltage applied to the element.

Figure 19:
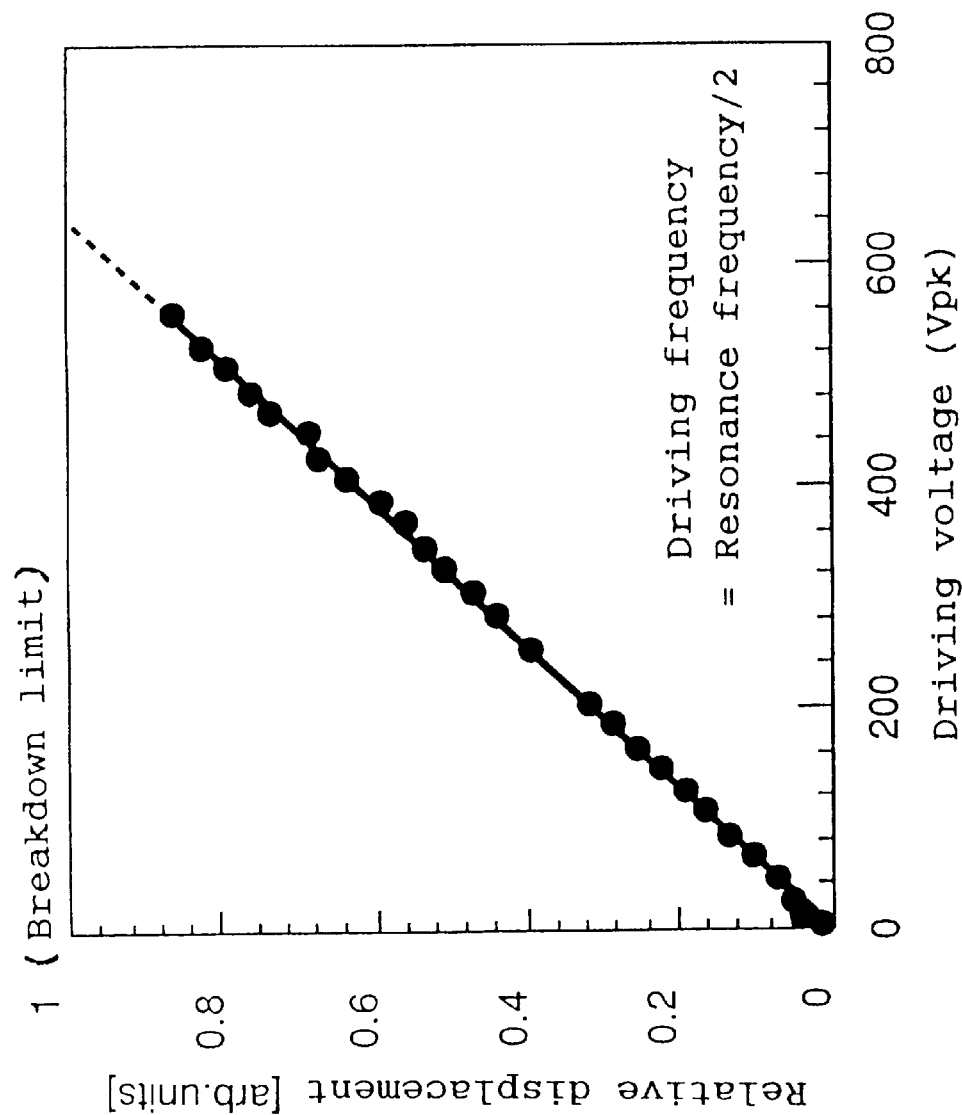
FIG. 19 is a graph visualizing an actuator characteristic of the precision displacement control actuator preferred as a second embodiment of the present invention.
Figure 20:
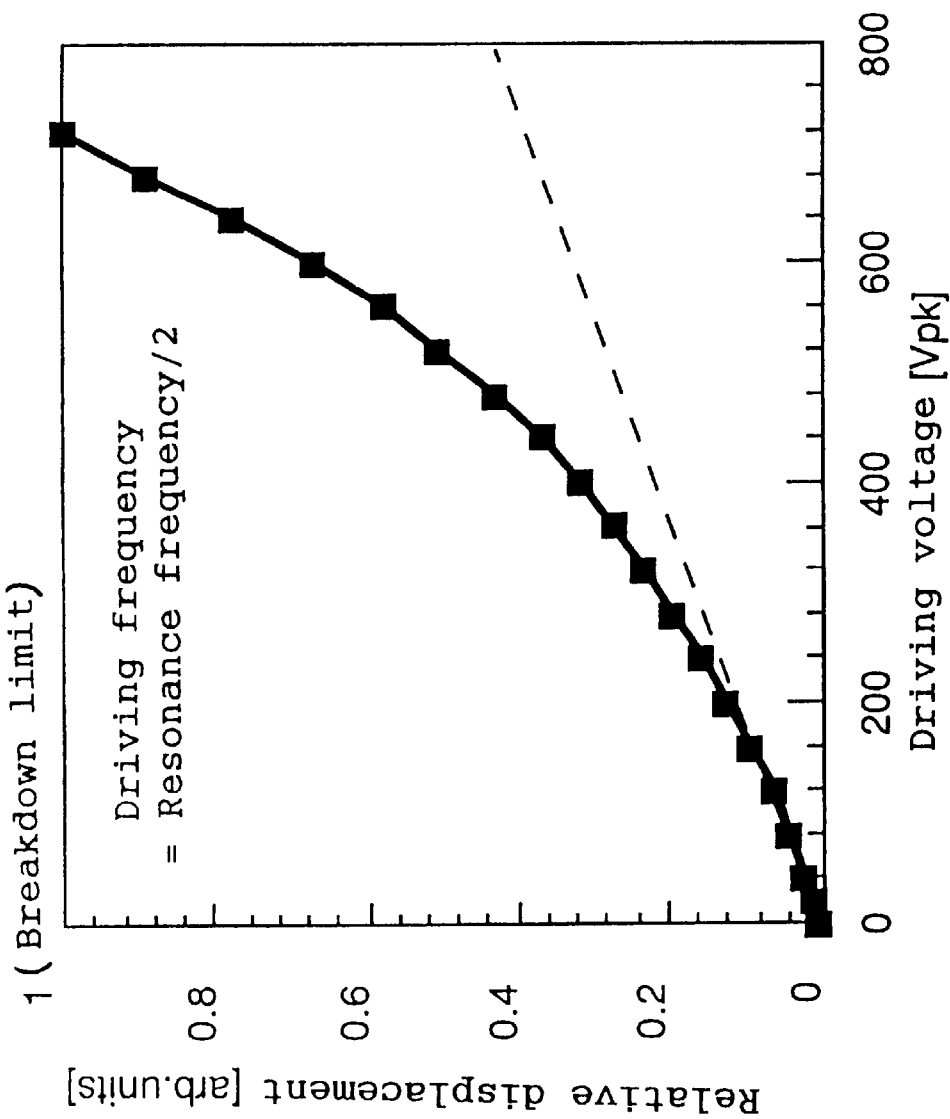
FIG. 20 is a graph visualizing an actuator characteristic of a bimorph type actuator having a cantilever structure according to the prior art.

Speaking concretely, the mechanical-electrical converter element exhibits the linearity up to 85% or higher of a voltage at a breakdown limit of the element (see FIG. 19). As a result, the mechanical-electrical converter element makes it possible to obtain a precision displacement control actuator with high control ability which is capable of controlling displacement by controlling the voltage only. Further, the mechanical-electrical converter element which utilizes the conventional piezoelectric ceramic substrates, exhibits a linearity up to 10% only of the breakdown limit.

Further, variations of a piezoelectric constant, a dielectric ratio, an elastic constant, etc. of $LiNbO_3$ are extremely small since it is a single crystal. In case of a piezoelectric ceramic, these material constants are ordinarily variable on the order of about 20%. Accordingly, the precision displacement control actuator which uses the piezoelectric ceramic are variable on the order of about 20%. In contrast, the precision displacement control actuator preferred as the second embodiment, which was manufactured by directly bonding the $LiNbO_3$ substrates, was capable of reducing variations of a displacement and a resonance frequency to 5% or lower.

The piezoelectric ceramic remarkably changes with time and is not stable. The precision displacement control actuator using the piezoelectric ceramic posed the problem that it allowed the displacement to vary with time on the order of 10 to 15%. In contrast, the precision displacement control actuator which was manufactured by directly bonding the $LiNbO_3$ substrates was extremely stable and allowed displacement to be varied with time within a range of 2% or lower.

A length, thickness and a width of the mechanical-electrical converter element 1 are determined taking a driving frequency into consideration. Ordinarily, the precision displacement control actuator has a larger displacement as the driving frequency becomes closer to the resonance frequency of the mechanical-electrical converter element.

The mechanical-electrical converter element 1 had a resonance frequency of 1.25 kHz when it was manufactured by directly bonding two $LiNbO_3$ substrates 50 μl thick, and had a cantilever structure set at 8 mm as measured from a tip to the support members.

The mechanical-electrical converter member 1 has a resonance frequency which is determined dependent on its length and thickness. In case of the precision displacement control actuator which uses the conventional piezoelectric ceramic, the mechanical-electrical converter element is supported by way of a bonding agent. The mechanical-electrical converter element is highly variable since it is difficult to control the amount of bonding agent to be applied, and a substantial length of the mechanical-electrical converter element is shortened due to squeeze-out of the bonding agent, etc.

Accordingly, the precision displacement control actuator which uses the conventional small piezoelectric ceramic allowed a resonance frequency of the mechanical-electrical converter element to be varied, thereby posing a problem that a displacement was varied within a driving frequency region.

In case of the second embodiment wherein the support members 4a and 4b (see FIG. 5) are bonded directly to the mechanical-electrical converter element 1, variations in length of the mechanical-electrical converter element 1 are extremely small. As a result, variations of a resonance frequency of the mechanical-electrical converter element 1 are extremely small.

Figure 9:
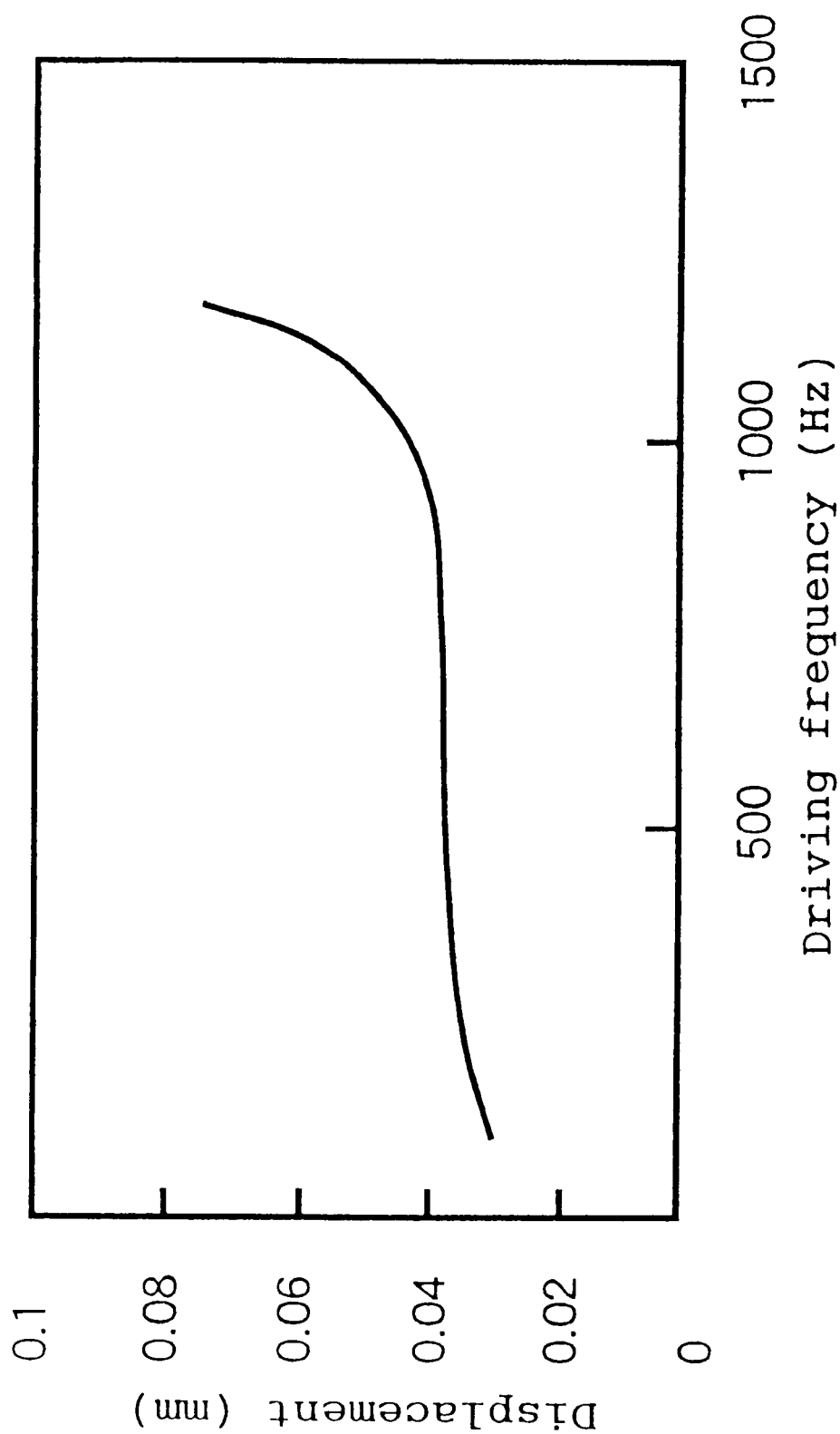
FIG. 9 is a graph visualizing a frequency characteristic of the precision displacement control actuator preferred as the first embodiment of the present invention.

As seen from measured results of displacements and driving frequencies shown in FIG. 9, displacements were remarkably enlarged at driving frequencies of 1 kHz and higher which were close to the resonance frequency of the mechanical-electrical converter element 1. In other words, it was difficult to control displacements with high precision at the frequencies of 1 kHz and higher since the displacements were influenced by resonance and were unstable.

In contrast, variations of length and thickness of the mechanical-electrical converter element 1 are extremely small in the second embodiment wherein the direct bonding is used to bond mechanical-electrical converter element 1, and bond the support members 4a and 4b to the mechanical-electrical converter element 1. As a result, the variations in resonance frequency are 5% or lower as described above and variations in displacement are extremely small in the vicinities of the resonance frequency.

In a field wherein a large displacement is required, it is therefore possible to restore a large displacement while suppressing variations of the displacement at a low level by setting a driving frequency in a vicinity of a resonance frequency.

In a field wherein a large displacement is not required, it is possible to remarkably reduce variations of displacement by separating the resonance frequency sufficiently far from the driving frequency so that the displacement is free from influences due to the resonance frequency within a driving frequency range. For this purpose, it is sufficient to design the mechanical-electrical converter element 1 so that it has a resonance frequency at least 1.5 times as high as a driving frequency.

Any single crystal piezoelectric material which can be bonded directly is usable as a material for the piezoelectric substrates 2a and 2b, or, it is possible to use, in addition to $LiNbO_3$, lithium tantalate ($LiTaO_3$), quartz, a langasite type piezoelectric crystal, lithium tetraborate ($Li_2B_4O_7$), potassium niobate ($KNbO_3$) or a PZT piezoelectric single crystal. Selectable as the langasite type piezoelectric single crystal is $La_3Ga_5Si_{14}$, $La_3Ga_{5.5}Nb_{0.5}O_{14}$ or $La_3Ga_{5.5}Ta_{0.5}O_{14}$.

Figure 11:
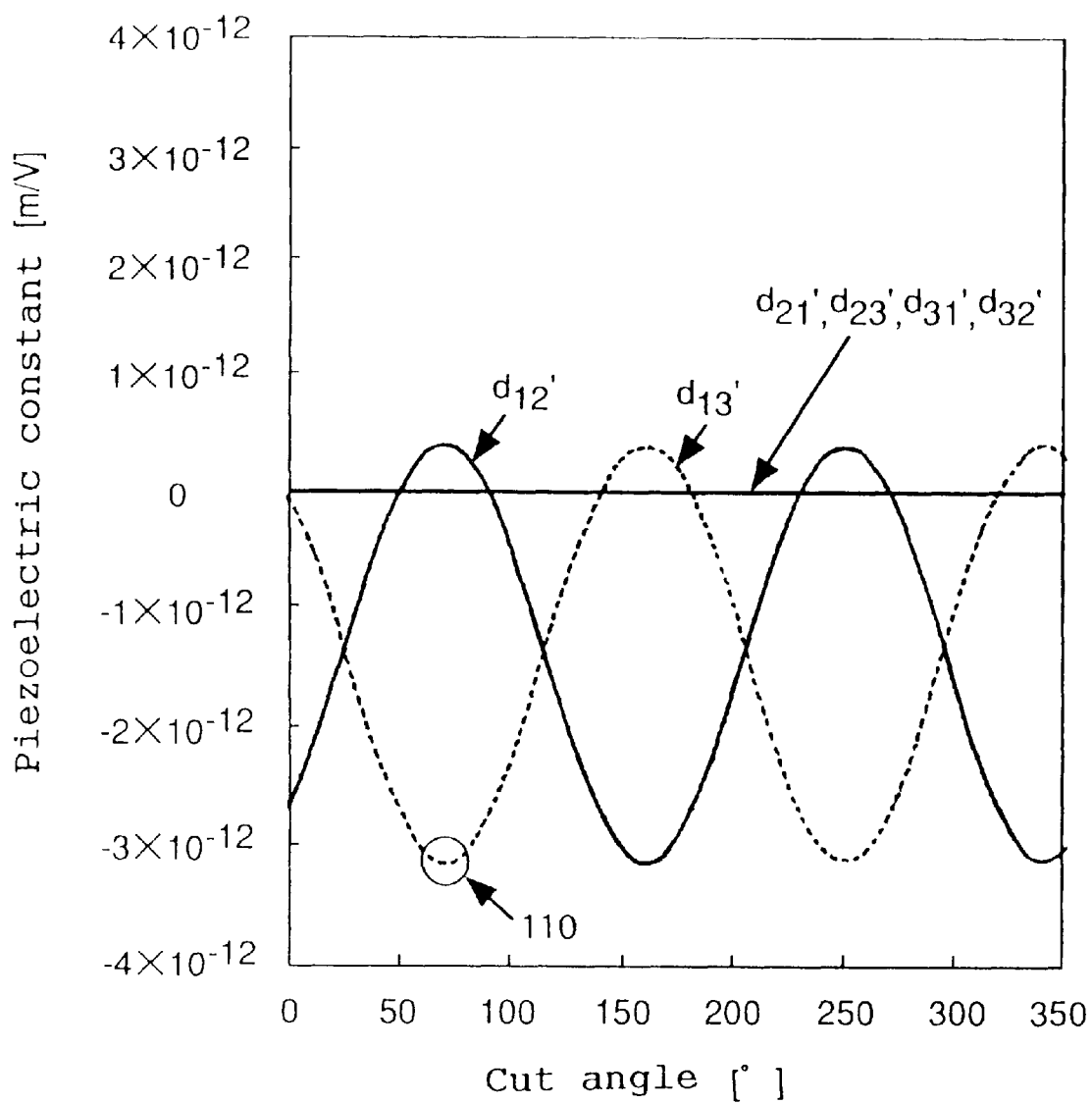
FIG. 11 is a graph visualizing the relationship between cut angles and piezoelectric constants of a quartz substrate.
Figure 12:
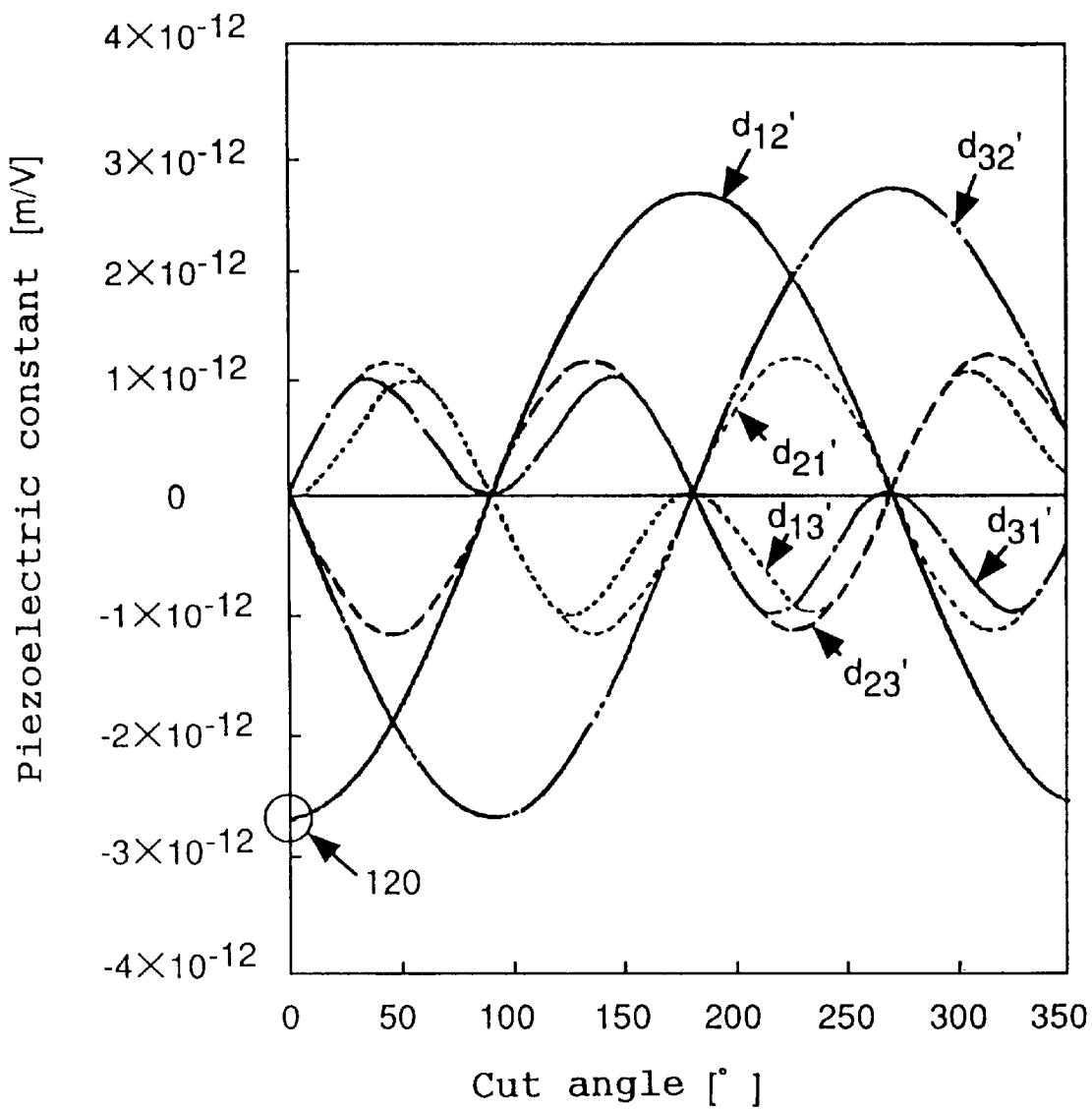
FIG. 12 is a graph visualizing the relationship between cut angles and piezoelectric constants of a quartz substrate.
Figure 13:
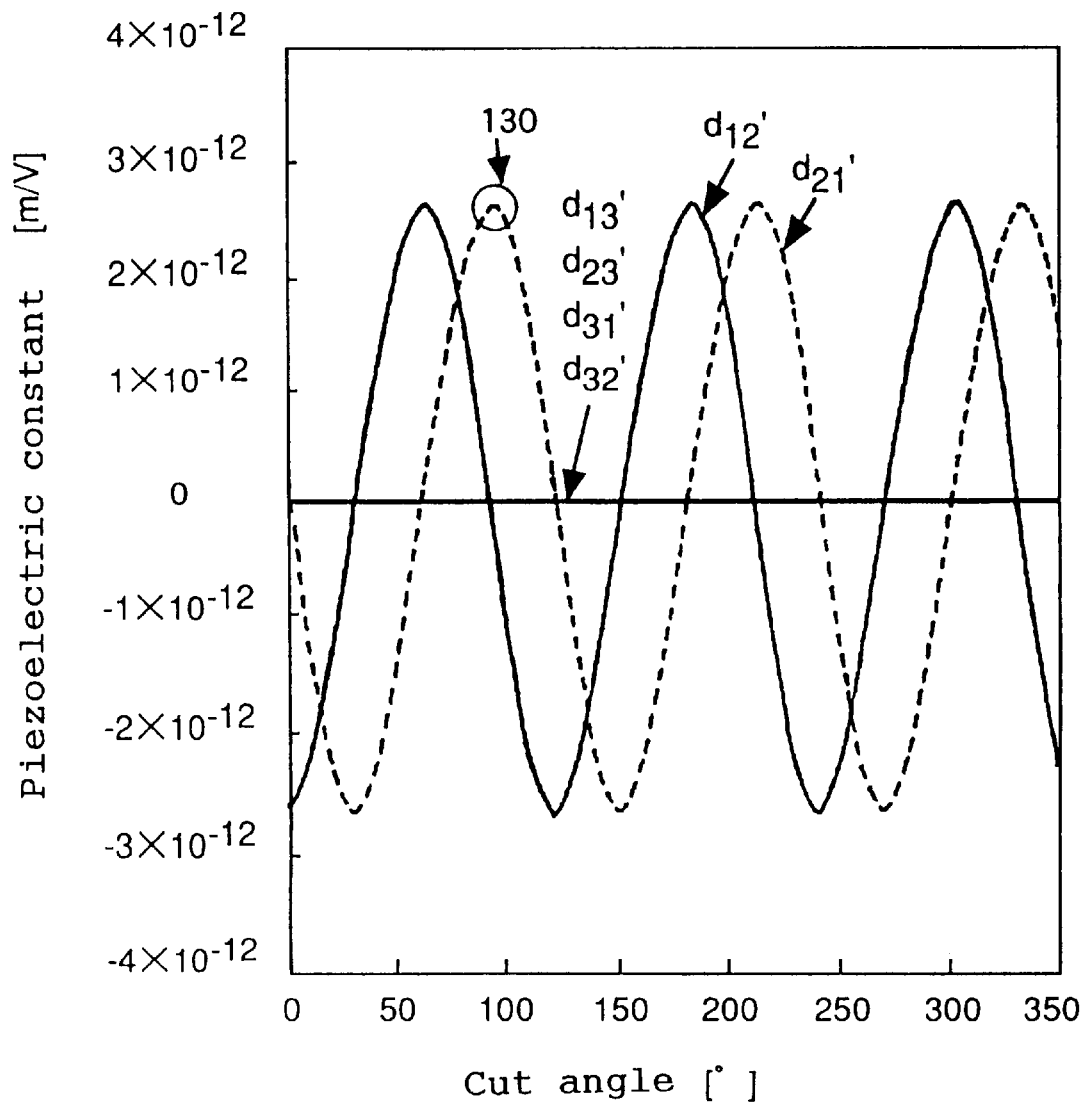
FIG. 13 is a graph visualizing the relationship between cut angles and piezoelectric constants of a quartz substrate.

$LiTaO_3$ has a crystallographic structure which is of the 3 m family of the trigonal system like that of $LiNbO_3$ and an optimum cut angle which is the same as that of $LiNbO_3$. Quartz and langasite type piezoelectric crystals have crystallographic structures which are of the 32 family of the trigonal system; $Li_2B_4O_7$ has a crystallographic structure which is a 4 mm family of the tetragonal system, and $KNbO_3$ and the PZT piezoelectric single crystal have crystallographic structures which are of the 6 mm family of the hexagonal system. FIGS. 11 through 13 illustrate relationship between a cut angle and a piezoelectric constant of a crystal substrate which has a crystallographic structure of the 32 family, FIGS. 21 through 23 show the relationship between a cut angle and a piezoelectric constant of a $Li_2B_4O_7$ substrate which has a crystallographic structure of the 4 mm family, and FIGS. 24 through 26 visualize relationship between a cut angle and a piezoelectric constant of a $KNbO_3$ substrate which has a crystallographic structure of the 6 mm family.

FIG. 11 illustrates the relationship between a cut angle and a piezoelectric constant of the crystal substrate when it is rotated around the X axis, FIG. 12 shows the relationship between a cut angle and a piezoelectric constant of the crystal substrate when it is rotated around the Y axis, FIG. 13 visualizes the relationship between a cut angle and a piezoelectric constant crystal substrate when it is rotated around the Z axis respectively. The langasite type piezoelectric crystal has a relationship between a cut angle and a piezoelectric constant which is similar to that shown in the figures mentioned above.

Figure 21:
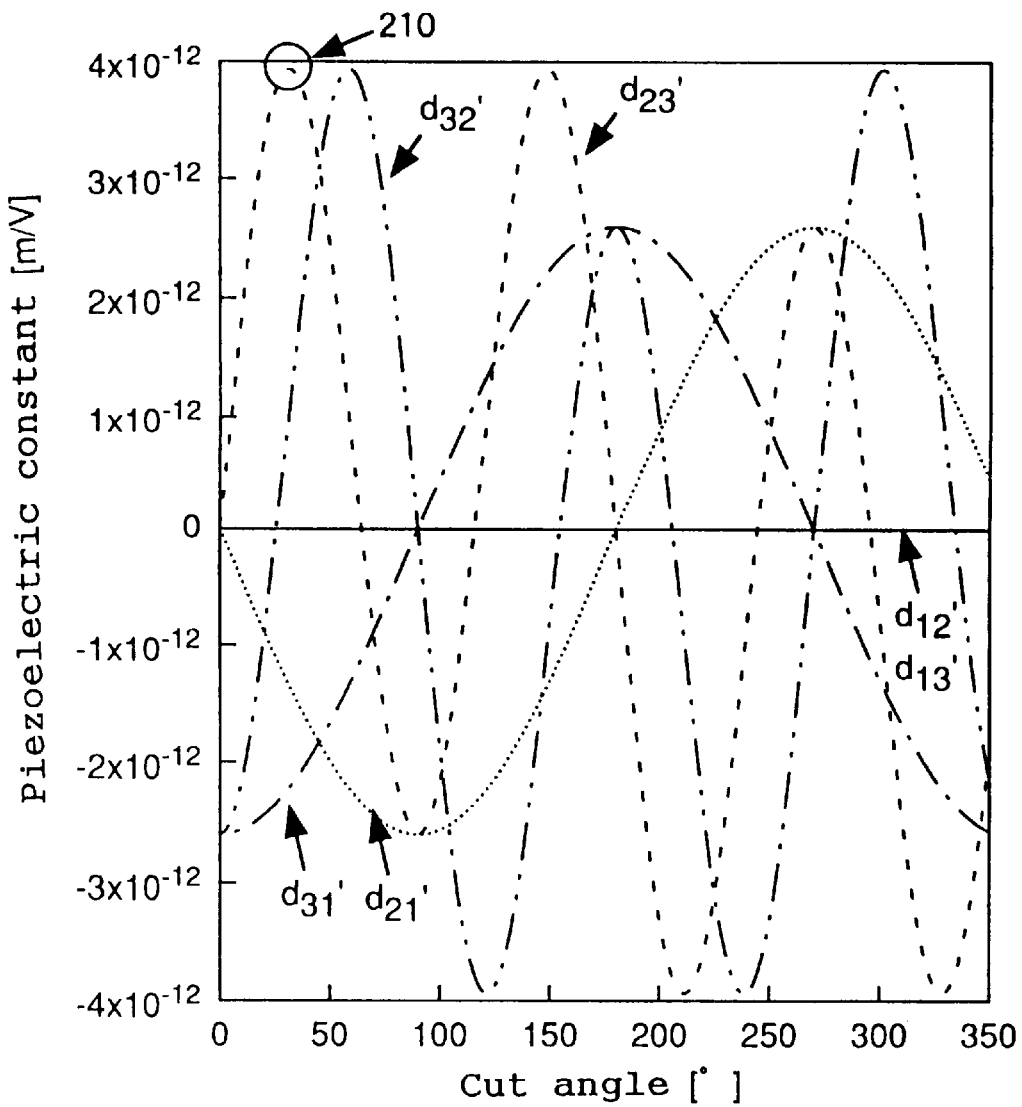
FIG. 21 is a graph visualizing the relationship between cut angles and piezoelectric constants of $Li_2B_4O_7$.
Figure 22:
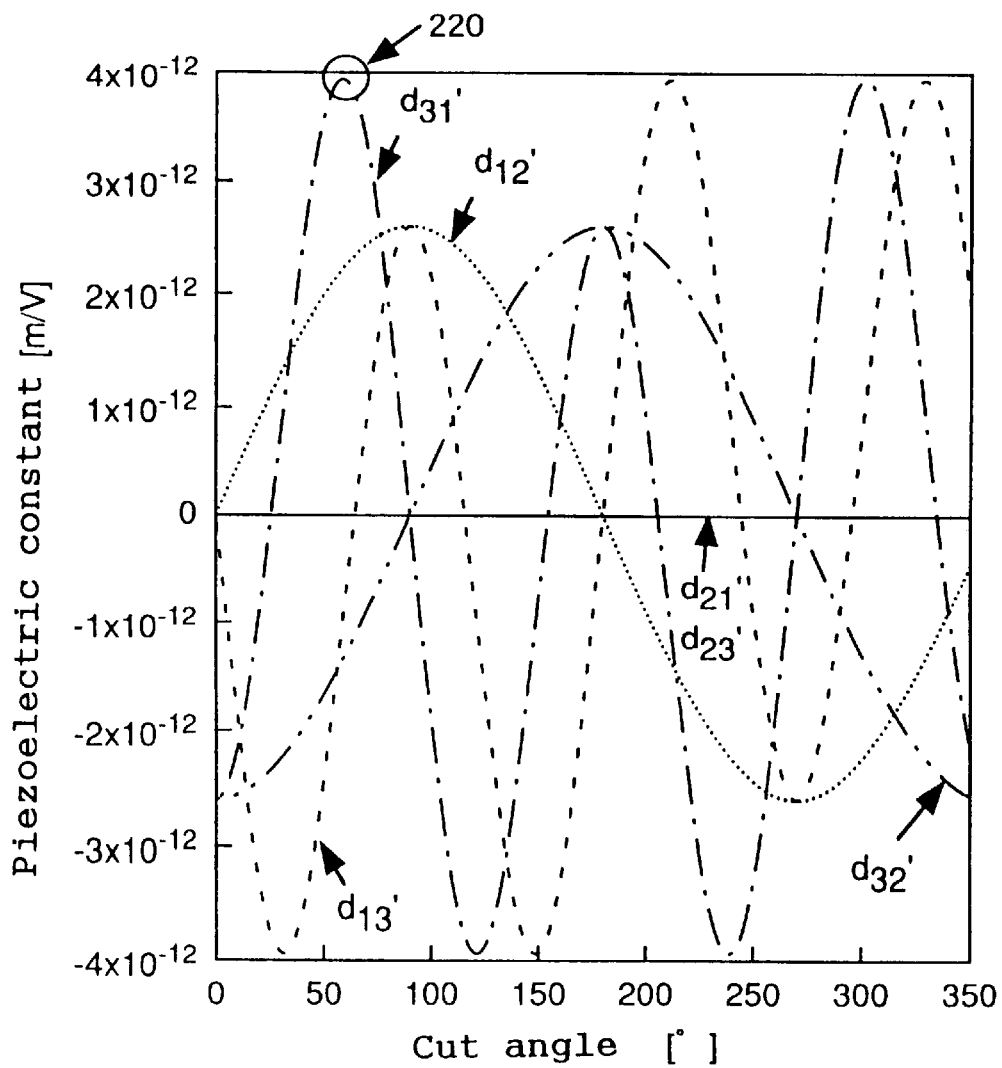
FIG. 22 is a graph visualizing the relationship between cut angles and the piezoelectric constants of $Li_2B_4O_7$.
Figure 23:
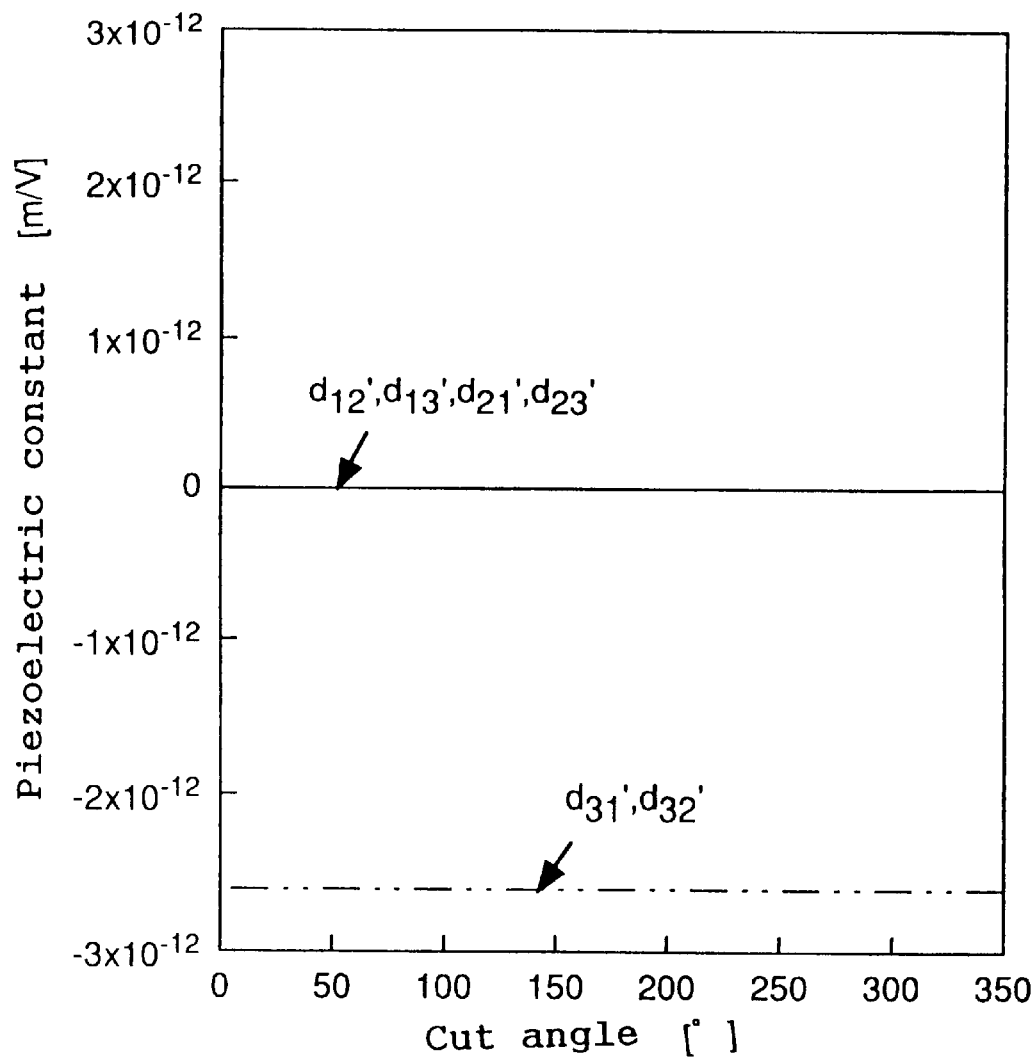
FIG. 23 is a graph illustrating the relationship between cut angles and the piezoelectric constant of $Li_2B_4O_7$.

FIG. 21 illustrates relationship between a cut angle and a piezoelectric constant of an $Li_2B_4O_7$ substrate of the 4 mm family when it is rotated around the X axis, FIG. 22 shows relationship between a cut angle and a piezoelectric constant when the $Li_2B_4O_7$ substrate is rotated around the Y axis, and FIG. 23 visualizes relationship between a cut angle and a piezoelectric constant when the $Li_2B_4O_7$ substrate is rotated around the Z axis respectively.

Figure 24:
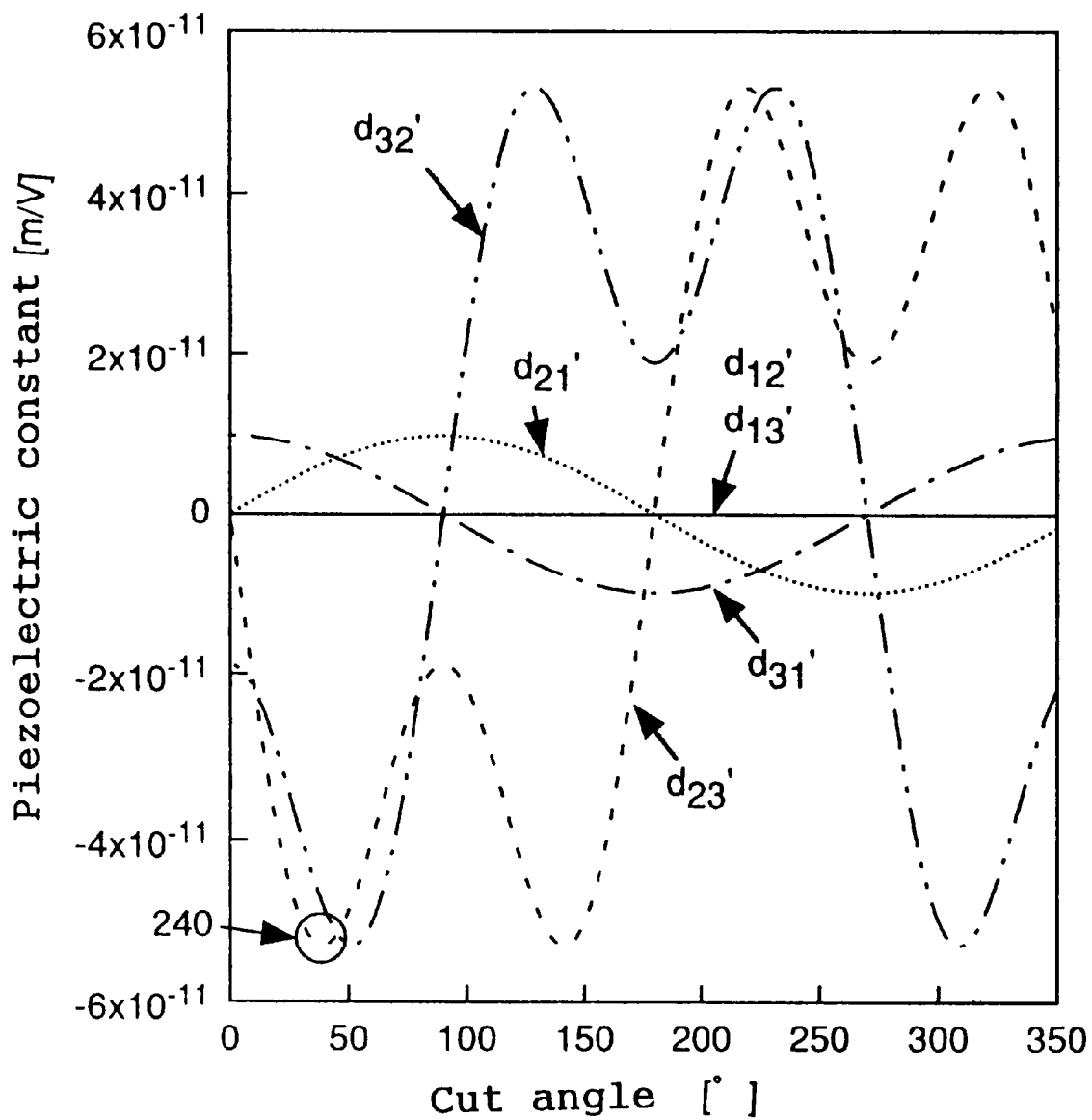
FIG. 24 is a graph visualizing the relationship between cut angles and piezoelectric constants of $KNbO_3$.
Figure 25:
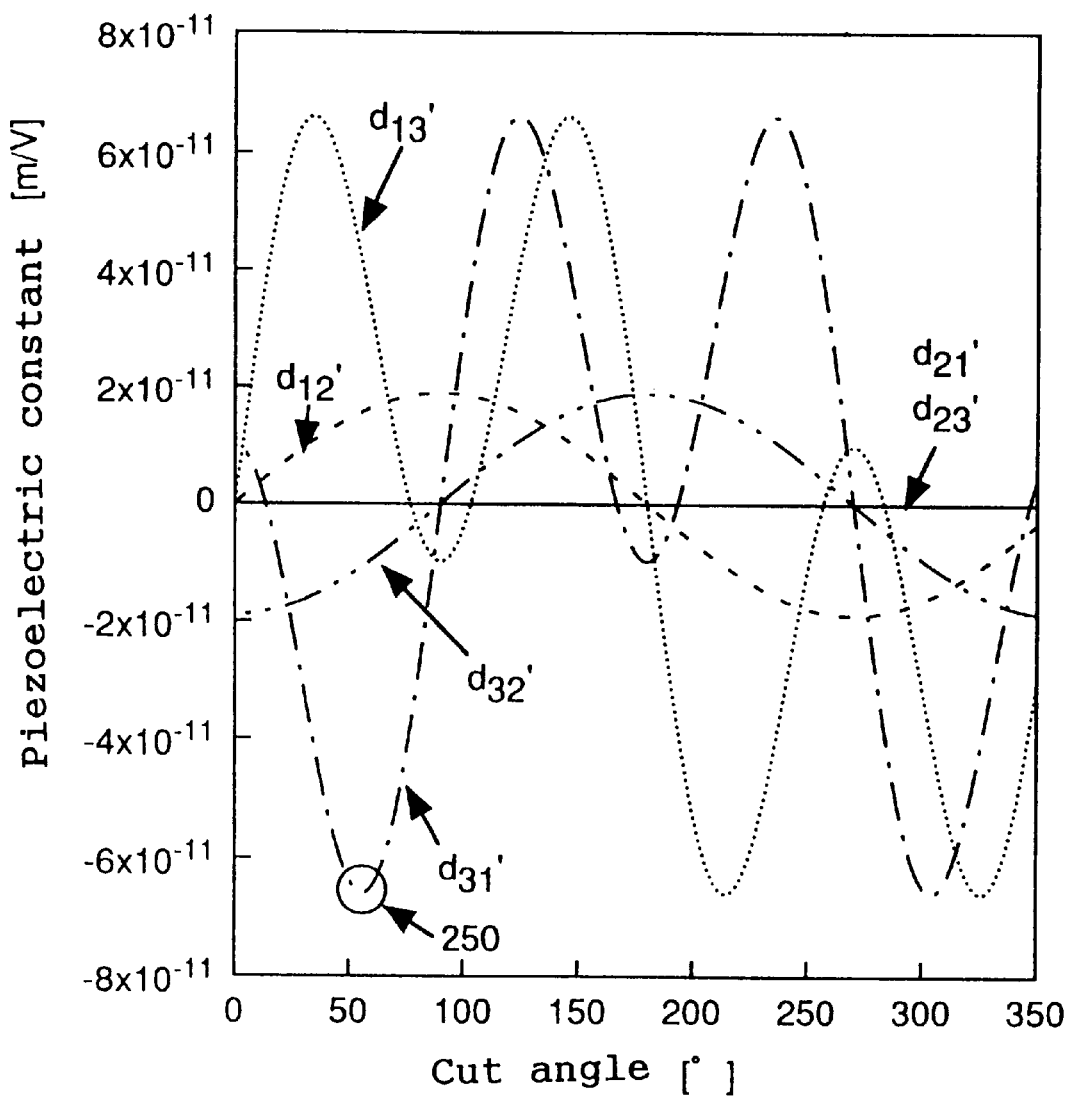
FIG. 25 is a graph visualizing the relationship between cut angles and the piezoelectric constants of $KNbO_3$.
Figure 26:
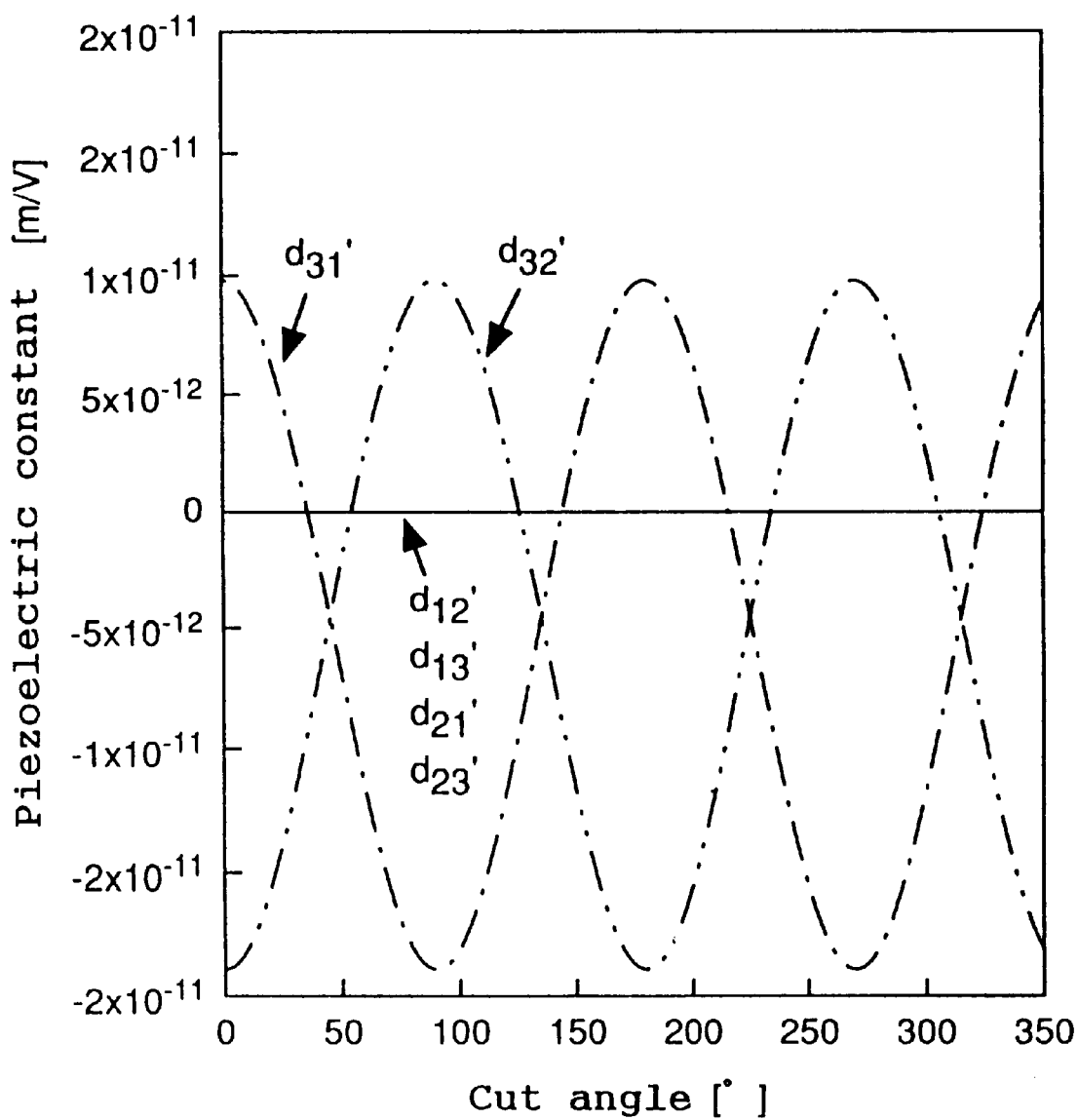
FIG. 26 is a graph visualizing the relationship between cut angles and the piezoelectric constants of $KNbO_3$.

FIG. 24 illustrates relationship between a cut angle and a piezoelectric constant of the $KNbO_3$ substrate of the 6 mm family when it is rotated around the X axis, FIG. 25 shows relationship between a cut angle and a piezoelectric constant when the $KNbO_3$ substrate is rotated around the Y axis and FIG. 26 visualizes relationship between a cut angle and a piezoelectric constant when the $KNbO_3$ substrate is rotated around the Z axis respectively. A substrate which is composed of the PZT single crystal has relationship between a cut angle and a piezoelectric constant which is similar to that shown in the figures mentioned above.

The following table (Table 2) lists optimum cut angles for single crystal piezoelectric materials having crystallographic structures of the 32 family which were determined from FIGS. 11 through 13 together with those for single crystal piezoelectric materials having crystallographic structure of the 3 m family, single crystal piezoelectric materials having crystallographic structures of the 4 mm family and single crystal piezoelectric materials having crystallographic structures of the 6 mm family.

TABLE 2

| Crystallographic structure | Name of substance | Optimum cut angle | Piezoelectric constant having extreme value |
|---|---|---|---|
| 3m trigonal system | Lithium niobate | 140,0,0 | d23' |
| | Lithium tantalate | 0,0,0 | d21' |
| 32 trigonal system | Quartz | 70,0,0 | d13' |
| | Langasite type piezoelectric crystal | 0,0,0 | d12' |
| | | 0,0,90 | d21' |
| 4 mm tetragonal system | Lithium tetraborate | 31,0,0 | d23' |
| | | 0,59,0 | d31' |

TABLE 2-continued

| Crystallographic structure | Name of substance | Optimum cut angle | Piezoelectric constant having extreme value |
|---|---|---|---|
| 6 mm hexagonal system | Potassium niobate | 39,0,0 | d23' |
| | PZT piezoelectric single crystal | 0,56,0 | d31' |

In the table shown above (Table 2), three numerals which represent Eulerian angles listed in columns of optimum cut angles represent sequentially rotating angles around the X axis, Y axis and Z axis. Further, piezoelectric constants which are maximum are also listed in the table shown above (Table 2). As shown in the above table (Table 2), a piezoelectric constant which is the maximum is $d_{13}'$ when a piezoelectric substance which has a crystallographic structure of the 32 family is rotated 70° around the X axis. This indicates that a maximum displacement is obtained by cutting a piezoelectric substrate in a direction perpendicular to the X' (=X axis) axis after rotation and setting a longitudinal direction of the piezoelectric substrate along the Z' axis when a piezoelectric substance having a crystallographic structure of the 32 family is rotated 70° around the X axis.

When the Eulerian angles are (0, 0 and 0), a piezoelectric constant which is the maximum is $d_{12}'$. This indicates that a maximum displacement is obtained by cutting a piezoelectric substrate in the direction perpendicular to the X' axis (=X axis) after rotation and setting the longitudinal direction of the piezoelectric substrate along the Y' axis when the Eulerian angles are (0, 0 and 0). A piezoelectric constant which is the maximum is $d_{21}'$ when the Eulerian angles are (0, 0 and 90). This indicates that a maximum displacement is obtained by cutting a piezoelectric substrate in a direction perpendicular to the Y' axis after rotation and setting the longitudinal direction of the piezoelectric substrate along the X' axis when the Eulerian angles are (0, 0 and 90).

In case of a piezoelectric substrate which has a crystallographic structure of the 32 family (quartz or the langasite type piezoelectric crystal), a problem is not posed due to degradation of displacement since the piezoelectric constant has values within a range from 90 to 100% of maximum values thereof as shown in FIGS. 11 through 13: $d_{13}'$ within a range from +52° to +86° (a maximum value is indicated by a numeral 110 in FIG. 11), d12' within a range from ±26° (indicated by a numeral 120 in FIG. 12) and $d_{21}'$ within a range from +82° to +98° (indicated by a numeral 130 in FIG. 13). Accordingly, it is possible to manufacture a precision displacement control actuator which has a large displacement without finishing a cut angle with high precision, thereby lowering the working cost.

In case of a piezoelectric substrate which has a crystallographic structure of the 4 mm family ($Li_2B_4O_7$ or the like), piezoelectric constants similarly have values within a range from 90 to 100% of maximum values thereof: $d_{23}'$ within a range from +22° to +41° (indicated by a numeral 210 in FIG. 21) and $d_{31}'$ within a range from +49° to +68° (indicated by a numeral 220 in FIG. 22). Further, $d_{31}'$ and $d_{32}'$ have values on the order of 85% of maximum values thereof but are constant independently of rotating angles when the Z axis is rotated. Accordingly, it is possible to obtain a displacement control actuator which has a large displacement while paying no attention to cut angles (see FIG. 23).

In case of a piezoelectric substrate which has a crystallographic structure of the 6 mm family (such as $KNbO_3$ or the PZT piezoelectric single crystal), no problem is posed due to the degradation of displacement since piezoelectric constants have values within a range from 90 to 100% of maximum values thereof: $d_{23}'$ within a range from +23° to +51° (indicated by a numeral 240 in FIG. 24) and $d_{31}'$ within a range from +46° to +66° (indicated by a numeral 250 in FIG. 25).

As understood from the foregoing description, the second embodiment which forms the mechanical-electrical converter element 1 by bonding firmly and directly the piezoelectric substrates 2a and 2b made of a single crystal piezoelectric material makes it possible to obtain a precision displacement control actuator which has excellent displacement linearity relative to an application voltage, and which features high controllability. Since the mechanical-electrical converter element 1 is formed by firmly and directly bonding the piezoelectric substrates 2a and 2b without using a binding layer such as a bonding agent, the second embodiment makes it also possible to obtain a precision displacement control actuator which is free from variations in characteristics and loss of flexure, and which has a large displacement. Further, the mechanical-electrical converter element 1 can be positioned with high precision since the mechanical-electrical converter element 1 is bonded directly to the support members 4a and 4b without using a bonding agent.

As a result, the second embodiment makes it possible to obtain a compact precision displacement control actuator which is free from variations in length or supported condition of a cantilever, and which is highly stable, and which has extremely small variations in characteristics.

Though chromium-nickel is used as the material for the electrodes 3a and 3b in the second embodiment, this material is not limitative, and gold, chromium, silver or an alloy may be selected as material for the electrodes.

(Third Embodiment)

Figure 14:
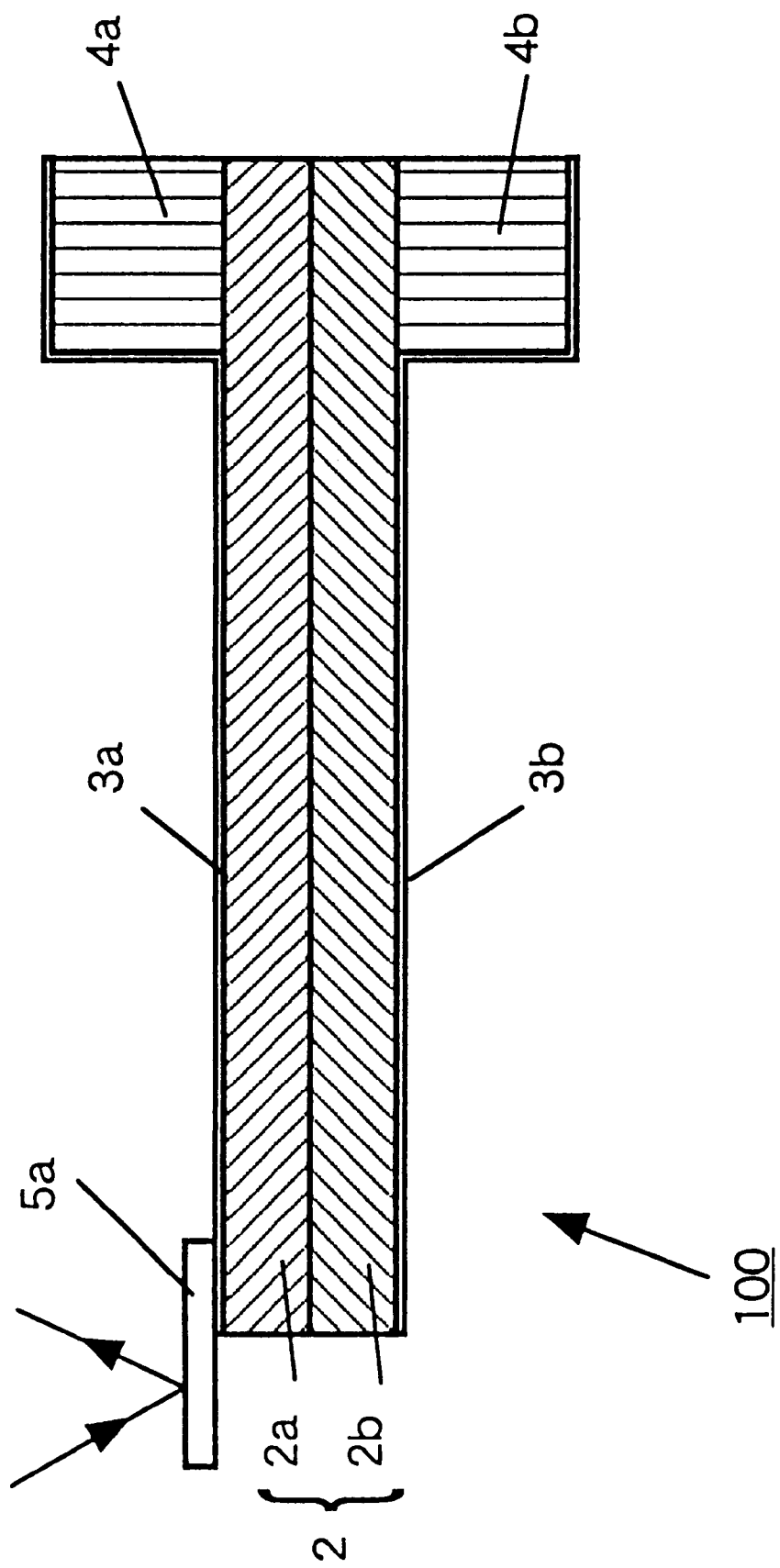
FIG. 14 is a sectional view illustrating a precision displacement control actuator preferred as a third embodiment of the present invention.

FIG. 14 is a sectional view illustrating a precision displacement control actuator which is preferred as the third embodiment of the present invention. Rectangular piezoelectric substrates 2a and 2b, which have two main surfaces opposed to each other, measure 50 μm thick by 1 mm wide by 8 mm long, and are made of $LiNbO_3$ are bonded directly on the main surfaces, thereby composing a mechanical-electrical converter element 1 as shown in FIG. 14. The piezoelectric substrates 2a and 2b are bonded so that they have axes of polarization in directions reverse to each other. An end of the mechanical-electrical converter element 1 is fixed in a condition where it is sandwiched between support members 4a and 4b made of $LiNbO_3$. The mechanical-electrical converter element 1 is bonded directly to the support members 4a and 4b. A reflecting plate 5a which is composed, for example, of a stainless steel plate plated on its surface with gold, is attached to a free end of the mechanical-electrical converter element 1 for reflecting rays.

Figure 15:
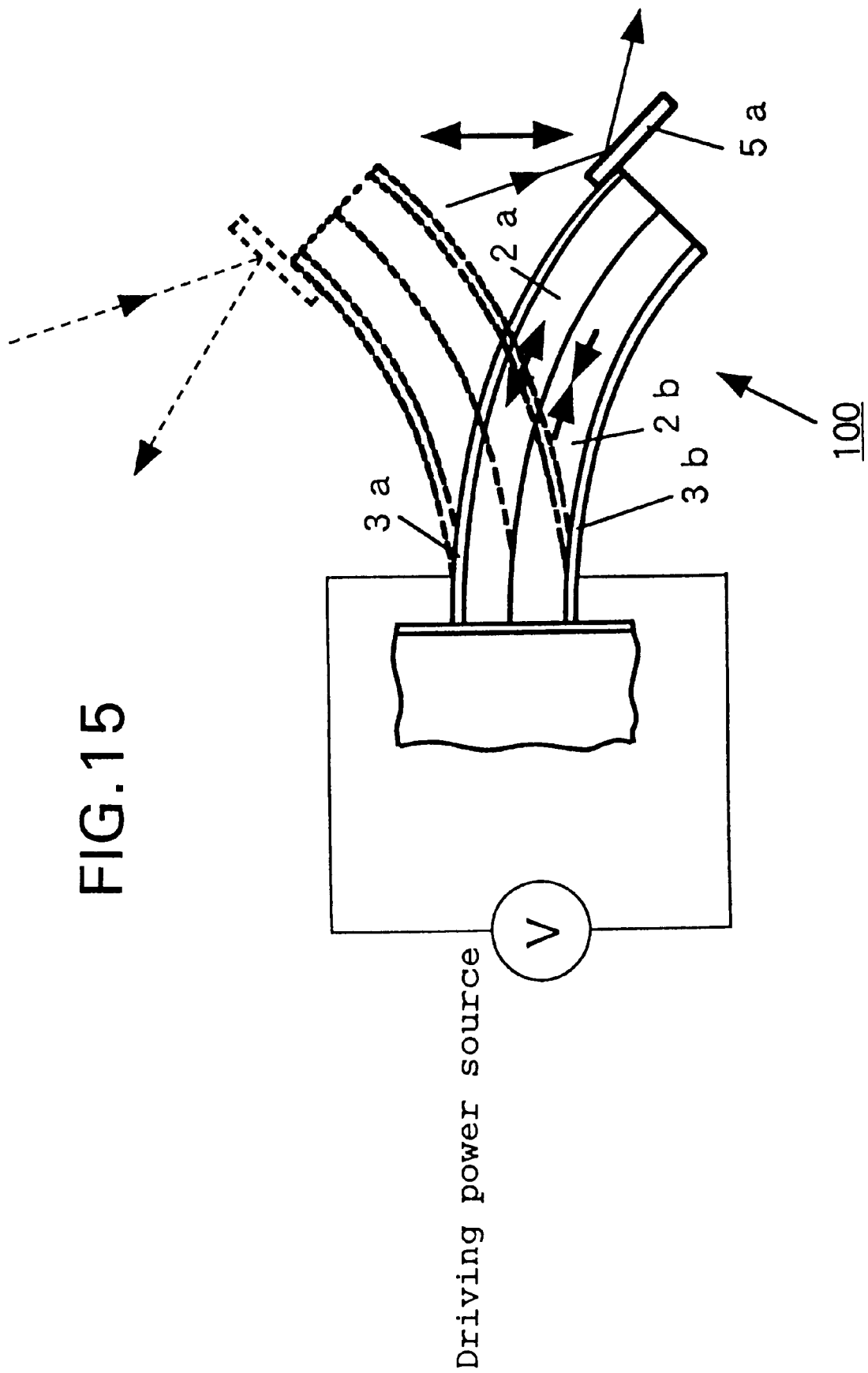
FIG. 15 is a diagram descriptive of a manner in which the precision displacement actuator preferred as the third embodiment of the present invention is excited to flexural vibrations and deflected.

The mechanical-electrical converter element 1 may be bonded directly to the support members 4a and 4b by way of a buffer layer composed of a thin film of silicon oxide. Electrodes 3a and 3b which are 0.2 μm thick and made of chromium-nickel are formed on the two main surfaces respectively of the mechanical-electrical converter element 1 opposed to each other so as to be continuous over the support members 4a and 4b. Accordingly, a precision displacement control actuator 100 for deflecting rays is composed. Though driving signals are applied in the same direction between the electrodes 3a and 3b of the mechanical-electrical converter element 1, which is made of LiNbO₃ or the like in the precision displacement control actuator 100 shown FIG. 14, an elongating or contracting strain is produced in the piezoelectric substrate 2a, and a strain reverse to that in the piezoelectric substrate 2a, is produced in the piezoelectric substrate 2b since the piezoelectric substrate 2a and the piezoelectric substrate 2b are bonded so that their axes of polarization are set in directions reverse to each other. Accordingly, the mechanical-electrical converter element 1 is excited to flexural vibrations around the end supported by the support members 4a and 4b, and reflects rays incident in the same direction (indicated by an arrow) with the reflecting plate 5a, thereby being capable of deflecting rays at an optional angle which is determined dependently on a voltage applied to the element (see FIG. 15).

The third embodiment has an excellent displacement linearity relative to an applied voltage since it uses the piezoelectric substrates 2a and 2b made of LiNbO₃, which has a stable piezoelectric characteristic. Speaking concretely, the third embodiment exhibits a linearity up to 85% or higher of a breakdown limit. As a result, the third embodiment makes it possible to obtain a precision displacement control actuator which has high controllability. A linearity of a mechanical-electrical converter element which utilizes the conventional piezoelectric ceramic substrates remains only up to 10% of the breakdown limit. Further, the precision displacement control actuator exhibits small variations in displacement since the piezoelectric substrates 2a and 2b are made of LiNbO₃, which is a material having small variations.

In case of the conventional mechanical-electrical converter element manufactured by bonding piezoelectric ceramic substrates, on the other hand, a bonding agent which is softer than the piezoelectric substrate is interposed between the piezoelectric substrates and absorbs strain produced in each piezoelectric substrate when the driving signals are applied to a mechanical-electrical converter element, thereby reducing strains effective for flexure. Accordingly, flexural vibrations excited in the mechanical-electrical converter element have a reduced amplitude.

In contrast, a bonding layer such as a bonding agent does not exist between the piezoelectric substrates 2a and 2b in the mechanical-electrical converter element 1 of the third embodiment since it is manufactured by directly bonding the piezoelectric substrates 2a and 2b like that used in the second embodiment. That is, the driving signals are converted into flexural vibrations with no loss when the driving signals are applied to produce strains in the piezoelectric substrates 2a and 2b since the mechanical-electrical converter element comprises no substance which absorbs the strains. As a result, the third embodiment makes it possible to obtain a precision displacement control actuator which has a large displacement.

Further, the third embodiment results in uniformity in the bonded condition between the piezoelectric substrates 2a and 2b, thereby very much reducing variations in resonance frequency and in displacement of the mechanical-electrical converter element 1.

Furthermore, the vibration characteristic of the mechanical-electrical converter element 1 is not changed by temperature variations since no bonding layer exists between the piezoelectric substrates 2a and 2b.

In addition, the relationship among cut angles, and variations in characteristics and displacements in the third embodiment is similar to that in the second embodiment.

(Fourth Embodiment)

Figure 16:
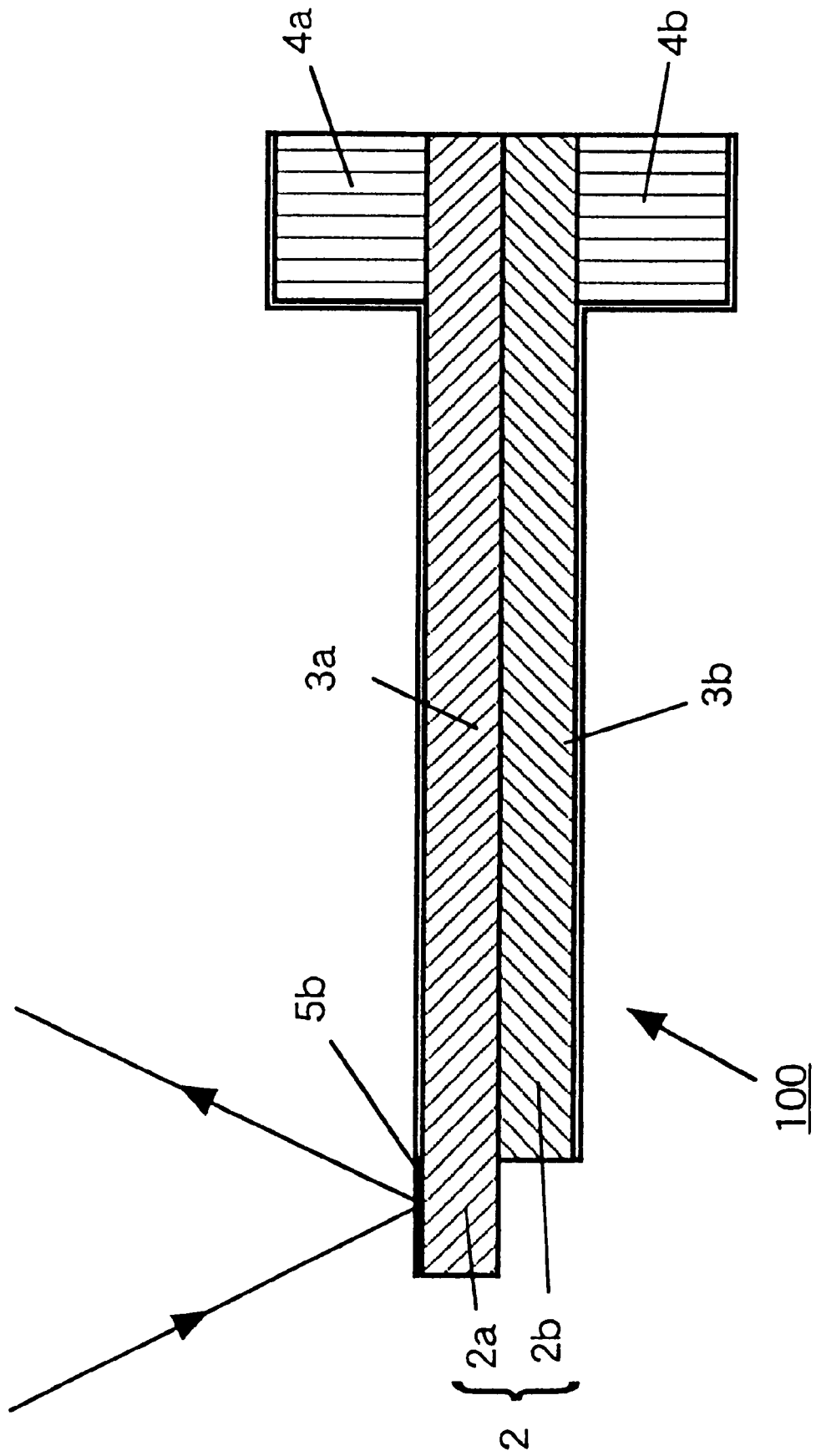
FIG. 16 is a sectional view illustrating a precision displacement actuator preferred as a fourth embodiment of the present invention.

FIG. 16 is a sectional view illustrating a precision displacement control actuator preferred as a fourth embodiment of the present invention. A little longer rectangular piezoelectric substrate 2a and a little shorter rectangular piezoelectric substrate 2b which have main surfaces opposed to each other, measure 50 μm thick, 1 mm wide by 8 mm long, and are made of LiNbO₃, are bonded directly on the main surfaces, thereby composing a mechanical-electrical converter element 1, as shown in FIG. 16. The piezoelectric substrate 2a and the piezoelectric substrate 2b are bonded so that their axes of polarization are set in directions reverse to each other. One end of the mechanical-electrical converter element 1 is fixed in a condition where it is sandwiched between support members 4a and 4b made of LiNbO₃. The mechanical-electrical converter element 1 is bonded directly to the support members 4a and 4b.

The mechanical-electrical converter element 1 may be bonded directly to the support members 4a and 4b by way of a buffer layer made of a thin film of silicon oxide. Electrodes 3a and 3b made of chromium-nickel 0.2 μm thick are formed on the two main surfaces respectively of the mechanical-electrical converter element 1, to a position corresponding to a tip of the piezoelectric substrate 2b on the piezoelectric substrate 2a in particular, and these electrodes 3a and 3b are continuous over the support members 4a and 4b. A tip of the piezoelectric substrate 2a beyond a tip of the electrode 3a forms a protruding portion, and a reflecting film 5b composed of gold 0.1 μm thick is formed on the protruding portion for reflecting rays, thereby composing a precision displacement control actuator 100 for deflecting rays.

Though driving signals are applied in one direction between the electrodes 3a and 3b of the mechanical-electrical converter element 1, which is made of LiNbO₃ or the like in the precision displacement control actuator 100 shown in FIG. 16, an elongating or contracting strain is produced in the piezoelectric substrate 2a and a strain reverse to that in the piezoelectric substrate 2a is produced in the piezoelectric substrate 2b since the piezoelectric substrate 2a and the piezoelectric substrate 2b are bonded so that their axes of polarization are set in directions reverse to each other. Accordingly, the mechanical-electrical converter element 1 is excited to flexural vibrations around the end supported by the support members 4a and 4b, whereby the reflecting film 5b deflects rays incident in one direction at an optional angle which is determined dependent on a voltage applied to the element.

The fourth embodiment has excellent displacement linearity relative to the application voltage since it uses the piezoelectric substrates 2a and 2b made of LiNbO₃ which has a stable piezoelectric characteristic. Speaking concretely, the fourth embodiment exhibits a linearity up to 85% or higher of a breakdown limit. As a result, the fourth embodiment makes it possible to obtain a precision displacement control actuator which has high controllability. A linearity of a mechanical-electrical converter element which utilizes the conventional piezoelectric ceramic substrates remains up to only 10% of the breakdown limit. Further, the precision displacement control actuator exhibits small variations in displacement since it uses the piezoelectric substrates 2a and 2b made of LiNbO₃, which is a material exhibiting small variations.

In case of the conventional mechanical-electrical converter element which is manufactured by bonding the piezoelectric ceramic substrates, on the other hand, a bonding agent which is softer than the piezoelectric substrate exists between the piezoelectric substrates and absorbs a strain produced in each piezoelectric substrate when the driving signals are applied to the mechanical-electrical converter element, thereby reducing a strain effective for flexure. Accordingly, an amplitude of flexural vibrations excited in the mechanical-electrical converter element is narrowed.

In contrast, a bonding layer such as a bonding agent does not exist between the piezoelectric substrates 2a and 2b in the mechanical-electrical converter element 1 of the fourth embodiment which is manufactured by bonding the piezoelectric substrates 2a and 2b like that used in the second embodiment. That is, the driving signals are converted into flexural vibrations with no loss when strains are produced in the piezoelectric substrates 2a and 2b by applying the driving signals since there is no substance which absorbs the strains. As a result, the fourth embodiment makes it possible to obtain a precision displacement control actuator which has a large displacement.

Further, the fourth embodiment uniformalizes a bonded condition between the piezoelectric substrates 2a and 2b like the second embodiment, thereby extremely reducing variations in resonance frequency and displacement of the mechanical-electrical converter element 1.

Furthermore, the fourth embodiment is free from variations in vibration characteristic of the mechanical-electrical converter element 1 due to temperature variations since no bonding layer exists between the piezoelectric substrates 2a and 2b.

In addition, relationship among a cut angle, and variations in characteristic and displacement in the fourth embodiment is similar to that in the second embodiment.

(Fifth Embodiment)

Figure 17:
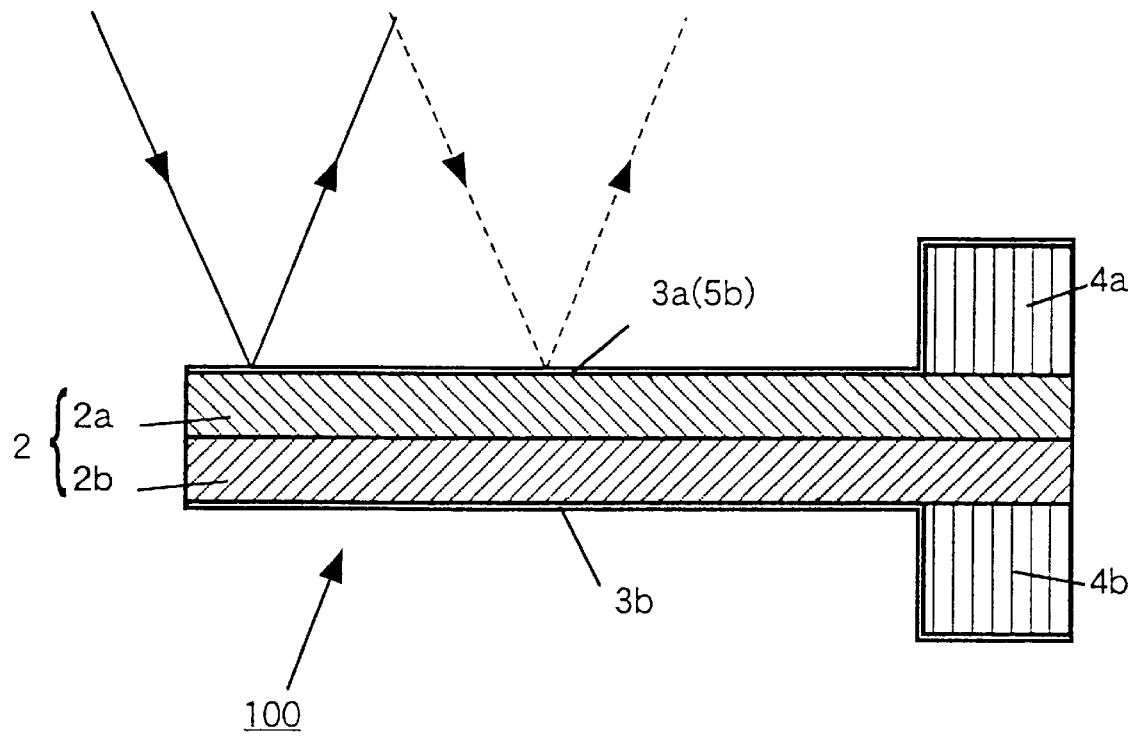
FIG. 17 is a sectional view illustrating a precision displacement control actuator preferred as a fifth embodiment of the present invention.

FIG. 17 is a sectional view illustrating a precision displacement control actuator preferred as a fifth embodiment of the present invention. Rectangular piezoelectric substrates 2a and 2b, each of which has two main surfaces opposed to each other, measures 50 μm thick by 1 mm wide by 8 mm long, and is made of LiNbO$_3$, are bonded directly on the main surfaces as shown in FIG. 17, thereby composing a mechanical-electrical converter element 1. The piezoelectric substrate 2a and the piezoelectric substrate 2b are bonded so that their axes of polarization are set in directions reverse to each other. One end of the mechanical-electrical converter element 1 is fixed in a condition where it is sandwiched between support members 4a and 4b made of LiNbO$_3$. The mechanical-electrical converter element 1 is bonded directly to the support members 4a and 4b.

The mechanical-electrical converter element 1 may be bonded directly to the support members 4a and 4b by way of a buffer layer made of silicon oxide or the like. Electrodes 3a and 3b, which are results of chromium-gold 0.2 μm thick and have roles of reflecting films 5b, are formed on the two main surfaces opposed to each other of the mechanical-electrical converter element 1, and these electrodes 3a and 3b are formed so as to be continuous over the support members 4a and 4b. Accordingly, a precision displacement control actuator 100 for deflecting rays composed.

Though driving signals are applied in one direction between the electrodes 3a and 3b of the mechanical-electrical converter element 1, which is made of LiNbO$_3$ or the like in the precision displacement control actuator 100 shown in FIG. 17, an elongating strain or a contracting strain is produced in the piezoelectric substrate 2a and a strain reverse to that in the piezoelectric substrate 2a is produced in the piezoelectric substrate 2b since the piezoelectric substrate 2a and the piezoelectric substrate 2b are bonded so that their axes of polarization are set in directions reverse to each other. Accordingly, the mechanical-electrical converter element 1 is excited to flexural vibrations around the end supported by the support members 4a and 4b, thereby being capable of deflecting rays incident in one direction with the reflecting film 5b (the electrode 3b) at an optional angle which is determined dependently on a voltage applied to the element.

The fifth embodiment exhibits an excellent linearity of displacement relative to an application voltage since it uses the piezoelectric substrates 2a and 2b made of LiNbO$_3$, which has a stable piezoelectric characteristic. Speaking concretely, the fifth embodiment exhibits a linearity up to 85% or higher of a breakdown limit. As a result, the fifth embodiment makes it possible to obtain a precision displacement control actuator which has high controllability. A linearity of a mechanical-electrical converter element which uses the conventional piezoelectric ceramic substrates remains up to only 10% of the breakdown limit. Further, variations of displacement of the precision displacement control actuator are small since it uses the piezoelectric substrates 2a and 2b made of LiNbO$_3$, which is a material having small variations.

In case of the conventional mechanical-electrical converter element which is manufactured by bonding the piezoelectric ceramic substrates, on the other hand, a bonding agent which is softer than the piezoelectric substrate exists between the piezoelectric substrates and absorbs a strain produced in each piezoelectric substrate when the driving signals are applied to the mechanical-electrical converter element, thereby reducing a strain effective for flexure. Accordingly, an amplitude of flexural vibrations excited in the mechanical-electrical converter element is narrowed.

In contrast, a bonding layer such as a bonding agent does not exist between the piezoelectric substrates 2a and 2b in the mechanical-electrical converter element 1 which is manufactured by directly bonding the piezoelectric substrates 2a and 2b like that used in the second embodiment. That is, the driving signals are converted into the strains, with no losses, when the strains are produced in the piezoelectric substrates 2a and 2b by applying the driving signals, since the mechanical-electrical converter element contains no substance which absorbs the strains. As a result, the fifth embodiment makes it possible to obtain a precision displacement control actuator which has a large displacement.

Like the second embodiment, the fifth embodiment results in a uniformly a bonded condition between the piezoelectric substrates 2a and 2b, thereby very much reducing variations in resonance frequency of the mechanical-electrical converter element 1, and in displacement.

Further, the fifth embodiment is free from variations in the vibration characteristics of the mechanical-electrical converter 1 due to temperature variations since it has no bonding layer interposed between the piezoelectric substrates 2a and 2b.

Furthermore, the relationship among cut angle, variations in characteristics and in displacement in the fifth embodiment are similar to that in the second embodiment.

Figure 18:
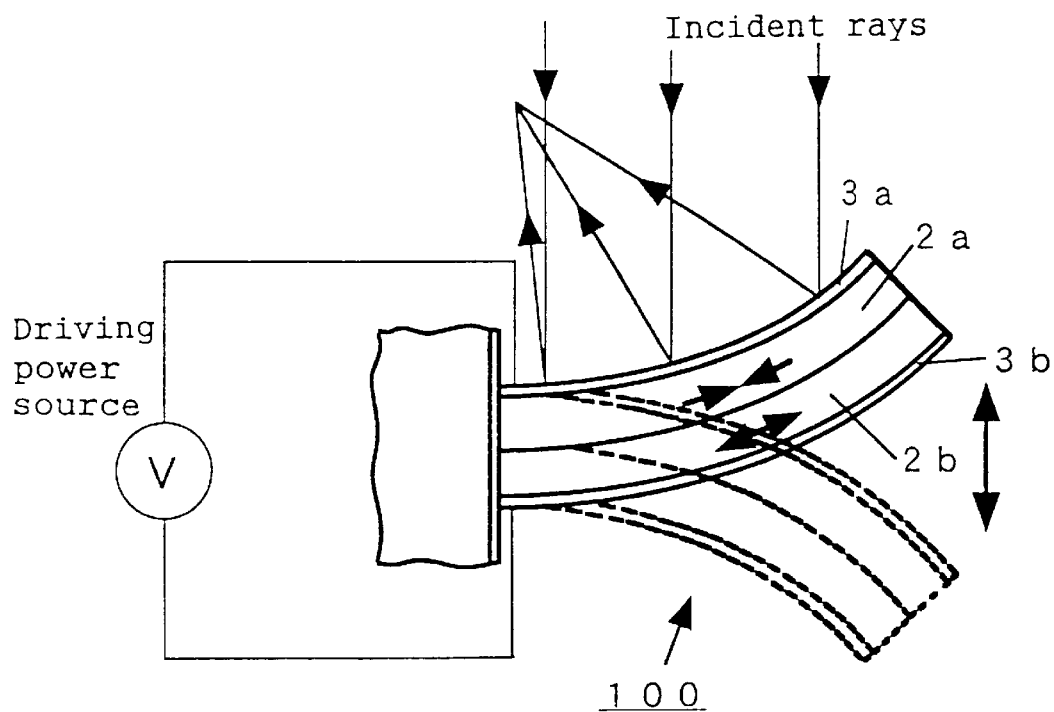
FIG. 18 is a diagram descriptive of a manner in which rays are condensed by the precision displacement control actuator preferred as the fifth embodiment of the present invention when it is utilized in a condenser apparatus.

In addition, the fifth embodiment excites the mechanical-electrical converter element 1 to flexural vibrations by applying driving signals between the electrodes 3a and 3b of the mechanical-electrical converter element 1 as shown in FIG. 18. When the electrodes 3a and 3b are made of a highly effective reflecting material such as chromium-gold, a dummy concave mirror can be formed by the flexure. Accordingly, the fifth embodiment is usable as a condenser apparatus.

The mechanical-electrical converter elements of the actuators preferred as the first through fifth embodiments described above can be excited to flexural vibrations and maintained in definite deformed conditions.

What is claimed is:

1. A displacement control actuator comprising:
   a mechanical-electrical converter element having
   (1) a piezoelectric element which is bonded by direct bonding between first main surfaces of at least two piezoelectric substrates, each substrate of which has a first main surface and a second main surface opposed to each other and
   (2) electrodes formed on said second main surfaces of said piezoelectric element; and
   support members which support said mechanical-electrical converter element, wherein said electrodes formed on said second main surfaces are formed on the entire surfaces of said second main surfaces other than a part of said second main surfaces to which said support members are bonded.

2. A displacement control actuator according to claim 1, wherein said first main surfaces of said two piezoelectric substrates are directly bonded by coupling atoms of said two piezoelectric substrates, by way of at least one member selected from oxygen and hydroxyl groups.

3. A displacement control actuator according to claim 1, wherein said two piezoelectric substrates are bonded so that their axes of polarization are set in directions reverse to each other.

4. A displacement control actuator according to claim 1, wherein a buffer layer formed on one of said two piezoelectric substrates is bonded directly to the other of said two piezoelectric substrates, said buffer layer being formed for correcting unevenness of bonding surfaces.

5. A displacement control actuator according to claim 1, wherein one end of said mechanical-electrical converter element is supported by support members.

6. A displacement control actuator according to claim 1, wherein said piezoelectric substrate is made of a single crystal piezoelectric material having a crystallographic structure of the 3 m family, wherein the main surface of said piezoelectric substrate is perpendicular to an axis having an angle of 129° to 152° from a Y axis, which angle can be obtained if said Y axis is rotated centering around an X axis, when crystallographic axes of said single crystal piezoelectric material are taken as X, Y and Z axes,
   wherein a straight line traced from a center of gravity of said piezoelectric substrate to a center of the portion of the second main surfaces to which the support members are bonded is perpendicular to said X axis.

7. A displacement control actuator according to claim 1, wherein said piezoelectric substrate is made of a single crystal piezoelectric material having a crystallographic structure of the 3 m family, wherein the main surface of said piezoelectric substrate is perpendicular to an axis having an angle of −26° to +26° from a Y axis, which angle can be obtained if said Y axis is rotated centering around an X axis when crystallographic axes of said single crystal piezoelectric material are taken as X, Y and Z axes, and
   wherein a straight line traced from a center of gravity of said piezoelectric substrate to a center of the portion of the second main surfaces to which the support members are bonded is in parallel with said X axis.

8. A displacement control actuator according to claim 1, wherein said piezoelectric substrate is made of a single crystal piezoelectric material having a crystallographic structure of the 32 family, wherein the main surface of said piezoelectric substrate is perpendicular to an X axis when crystallographic axes of said single crystal piezoelectric material are taken as X, Y and Z axes, and
   wherein a straight line traced from a center of gravity of said piezoelectric substrate to a center of the portion of the second main surfaces to which the support members are bonded intersects with said Z axis at an angle of +52° to +86°.

9. A displacement control actuator according to claim 1, wherein said piezoelectric substrate is made of a single crystal piezoelectric material having a crystallographic structure of the 32 family, wherein the main surface of said piezoelectric substrate is perpendicular to an axis having an angle of −26° to +26° from an X axis, which angle can be obtained if said X axis is rotated centering around a Y axis and includes a Y axis when crystallographic axes of said single crystal piezoelectric material are taken as X, Y and Z axes, and
   wherein a straight line traced from a center of gravity of said piezoelectric substrate to a center of the portion of the second main surfaces to which the support members are bonded is in parallel with said Y axis.

10. A displacement control actuator according to claim 1, wherein said piezoelectric substrate is made of a single crystal piezoelectric material having a crystallographic structure of the 32 family,
    wherein the main surface of said piezoelectric substrate is perpendicular to an axis having an angle of +82° to +98° from an X axis which angle can be obtained if said X axis is rotated centering around a Z axis and includes a Z axis when crystallographic axes of said single crystal piezoelectric material are taken as X, Y and Z axes, and
    wherein a straight line traced from a center of gravity of said piezoelectric substrate to a center of the portion of the second main surfaces to which the support members are bonded is perpendicular to said Z axis.

11. A displacement control actuator according to claim 1, wherein said piezoelectric substrate is made of a single crystal piezoelectric material having a crystallographic structure of the 4 mm family,
    wherein the main surface of said piezoelectric substrate is perpendicular to an axis having an angle of +22° to +41° from a Y axis, which angle can be obtained if said Y axis is rotated centering around an X axis and includes an X axis when crystallographic axes of said single crystal piezoelectric material are taken as X, Y and Z axes, and
    wherein a straight line traced from a center of gravity of said piezoelectric substrate to a center of the portion of the second main surfaces to which the support members are bonded is perpendicular to said X axis.

12. A displacement control actuator according to claim 1, wherein said piezoelectric substrate is made of a single crystal piezoelectric material having a crystallographic structure of the 4 mm family,
    wherein the main surface of said piezoelectric substrate is perpendicular to an axis having an angle of +49° to +68° from a Z axis, which angle can be obtained if said Z axis is rotated centering around a Y axis and includes a Y axis when crystallographic axes of said single crystal piezoelectric material are taken as X, Y and Z axes, and
    wherein a straight line traced from a center of gravity of said piezoelectric substrate to a center of the portion of the second main surfaces to which the support members are bonded is perpendicular to said Y axis.

13. A displacement actuator according to claim 1,
wherein said piezoelectric substrate is made of a single crystal piezoelectric material having a crystallographic structure of the 4 mm family, and
wherein the main surface of said piezoelectric substrate is perpendicular to a Z axis when crystallographic axes of said single crystal piezoelectric material are taken as X, Y and Z axes.

14. A displacement control actuator according to claim 1,
wherein said piezoelectric substrate is made of a single crystal piezoelectric material having a crystallographic structure of the 6 mm family,
wherein the main surface of said piezoelectric substrate is perpendicular to an axis having an angle of +23° to +51° from a Y axis, which angle can be obtained if said Y axis is rotated centering around an X axis and includes an X axis when crystallographic axes of said single crystal piezoelectric material are taken as X, Y and Z axes, and
wherein a straight line traced from a center of gravity of said piezoelectric substrate to a center of the portion of the second main surfaces to which the support members are bonded is perpendicular to said X axis.

15. A displacement control actuator according to claim 1,
wherein said piezoelectric substrate is made of a single crystal piezoelectric material having a crystallographic structure of the 6 mm family,
wherein the main surface of said piezoelectric substrate is perpendicular to an axis having an anile of +46° to +66° from a Z axis, which angle can be obtained if said Z axis is rotated centering around a Y axis and includes a Y axis when crystallographic axes of said single crystal piezoelectric material are taken as X, Y and Z axes, and
wherein a straight line traced from a center of gravity of said piezoelectric substrate to a center of the portion of the second main surfaces to which the support members are bonded is perpendicular to said Y axis.

16. A displacement control actuator comprising:
a mechanical-electrical converter element for converting electrical input to mechanical movement having
(1) a piezoelectric element bonded by direct bonding between first main surfaces of at least two piezoelectric substrates each of which has a first main surface and a second main surface opposed to each other, and
(2) electrodes formed on said second main surfaces respectively of said piezoelectric element; and
support members which support said mechanical-electrical converter element,
wherein said mechanical-electrical converter element is bonded to said support members by direct bonding, and
wherein said electrodes formed on said second main surfaces are formed on the entire surfaces of said second main surfaces other than a part of said second main surfaces to which said support members are bonded.

17. A displacement control actuator according to claim 16,
wherein said piezoelectric substrates, which comprise said mechanical-electrical converter element, and said support members, are directly bonded by coupling atoms of said piezoelectric substrates and atoms of said support members by way of at least one member selected from oxygen and a hydroxyl group.

18. A displacement control actuator according to claim 16,
wherein said piezoelectric substrates and said support members are made of the same material.

19. A displacement control actuator comprising:
a mechanical-electrical converter element for converting electrical input to mechanical movement having
(1) a piezoelectric element bonded by direct bonding between first main surfaces of at least two piezoelectric substrates each of which has a first main surface and a second main surface opposed to each other and
(2) electrodes formed on said second main surfaces respectively of said piezoelectric element; and
support members which support said mechanical-electrical converter element,
wherein said mechanical-electrical converter element is bonded to said support members by direct bonding, and
wherein a reflecting plate is attached to a free end of said mechanical-electrical converter element, and
wherein said electrodes formed on said second main surfaces are formed on the entire surfaces of said second main surfaces other than a part of said second main surfaces to which said support members are bonded.

20. A displacement control actuator comprising:
a mechanical-electrical converter element for converting electrical input to mechanical movement having
(1) a piezoelectric element bonded by direct bonding between first main surfaces of at least two piezoelectric substrates each of which has a first main surface and a second main surface opposed to each other and
(2) electrodes formed on said second main surfaces respectively of said piezoelectric element; and
support members which support said mechanical-electrical converter element,
wherein each said mechanical-electrical converter elements is bonded to said support members by direct bonding, and
wherein one of the piezoelectric substrates which compose said piezoelectric element is longer than the other piezoelectric substrate, and
wherein said electrodes formed on said second main surfaces are formed on the entire surfaces of said second main surfaces other than a part of said second main surfaces to which said support members are bonded, and
wherein a reflecting film is formed on a surface of a portion of said longer piezoelectric substrate which protrudes beyond a tip of said other piezoelectric substrate.

21. A displacement control actuator comprising:
a mechanical-electrical converter element for converting electrical input to mechanical movement having
(1) a piezoelectric element bonded by direct bonding between first main surfaces of at least two piezoelectric substrates each of which has a first main surface and a second main surface opposed to each other and
(2) electrodes formed on said second main surfaces respectively of said piezoelectric element; and support members which support said mechanical-electrical converter element, wherein said mechanical-electrical converter element is bonded to said support members by direct bonding, and wherein said electrodes formed on said second main surfaces are formed on the entire surfaces of said second main surfaces other than a part of said second main surfaces to which said support members are bonded, and wherein reflecting film is formed on a surface of said piezoelectric substrate.

22. A displacement control actuator according to claim 19, wherein said piezoelectric substrates, which comprise said mechanical-electrical converter element, and said support members, are directly bonded by coupling atoms of said piezoelectric substrates and coupling atoms of said support members by way of at least one member selected from oxygen and a hydroxyl group.

23. A displacement control actuator according to claim 16, wherein a buffer layer formed on said piezoelectric substrate is directly bonded to said support members, or a buffer layer formed on said support members is directly bonded to said piezoelectric substrate, and wherein said electrodes formed on said second main surfaces are formed on the entire surfaces of said second main surfaces other than a part of said second main surfaces to which said support members are bonded.

24. A displacement control actuator according to claim 19, wherein said piezoelectric substrates and said support members are made of the same material.

25. A displacement control actuator according to claim 21, wherein all or part of said electrodes serve as a reflecting film.

* * * * *